(12) United States Patent
Hayashi

(10) Patent No.: US 11,329,203 B2
(45) Date of Patent: May 10, 2022

(54) LIGHT EMITTING DEVICE INCLUDING COVERING MEMBER AND OPTICAL MEMBER

(71) Applicant: NICHIA CORPORATION, Anan (JP)

(72) Inventor: Tadao Hayashi, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/022,476

(22) Filed: Jun. 28, 2018

(65) Prior Publication Data

US 2019/0006568 A1 Jan. 3, 2019

(30) Foreign Application Priority Data

Jun. 28, 2017 (JP) .............................. JP2017-125711
May 25, 2018 (JP) .............................. JP2018-100322

(51) Int. Cl.

| | |
|---|---|
| *H01L 33/60* | (2010.01) |
| *H01L 33/40* | (2010.01) |
| *H01L 33/50* | (2010.01) |
| *H01L 33/38* | (2010.01) |
| *H01L 33/52* | (2010.01) |
| *H01L 33/54* | (2010.01) |
| *H01L 33/58* | (2010.01) |

(52) U.S. Cl.
CPC .............. *H01L 33/60* (2013.01); *H01L 33/38* (2013.01); *H01L 33/40* (2013.01); *H01L 33/502* (2013.01); *H01L 33/52* (2013.01); *H01L 33/54* (2013.01); *H01L 33/58* (2013.01); *H01L 33/50* (2013.01)

(58) Field of Classification Search
CPC ......... H01L 23/60; H01L 33/58; H01L 33/60; H01L 33/38; H01L 33/40; H01L 33/502; H01L 33/52; H01L 33/54; H01L 33/50
USPC .......................................................... 257/98
See application file for complete search history.

(56) References Cited

U.S. PATENT DOCUMENTS

2006/0273337 A1 12/2006 Han et al.
2007/0212802 A1* 9/2007 Lee .......................... H01L 33/54
438/22

(Continued)

FOREIGN PATENT DOCUMENTS

| | | |
|---|---|---|
| JP | 2005-353875 A | 12/2005 |
| JP | 2006-339650 A | 12/2006 |

(Continued)

*Primary Examiner* — Lex H Malsawma
*Assistant Examiner* — Laura M Dykes
(74) *Attorney, Agent, or Firm* — Foley & Lardner LLP

(57) ABSTRACT

A light emitting device includes: a light emitting element comprising: a semiconductor multilayer structure that has an electrode formation surface, a light-emitting surface opposite to the electrode formation surface, and side surfaces between the electrode formation surface and the light-emitting surface, and a pair of electrodes provided on the electrode formation surface; a covering member covering the side surfaces of the light emitting element; and an optical member disposed over the light-emitting surface of the light emitting element and an upper surface of the covering member, the optical member comprising: a light-reflective portion disposed above the light emitting element, and a light-transmissive portion disposed between the light-reflective portion and the covering member and forming a part of an outer side surface of the light emitting device.

20 Claims, 15 Drawing Sheets

(56) References Cited

U.S. PATENT DOCUMENTS

| | | |
|---|---|---|
| 2008/0254558 A1 | 10/2008 | Han et al. |
| 2010/0008628 A1* | 1/2010 | Shani .................. G02B 6/0018 385/49 |
| 2011/0062469 A1* | 3/2011 | Camras .................. H01L 33/58 257/98 |
| 2011/0266571 A1 | 11/2011 | Zeiler et al. |
| 2012/0250350 A1 | 10/2012 | Kim et al. |
| 2014/0054616 A1 | 2/2014 | Tseng et al. |
| 2014/0054619 A1 | 2/2014 | Tseng et al. |
| 2014/0061699 A1 | 3/2014 | Kim |
| 2014/0103372 A1 | 4/2014 | Tseng et al. |
| 2014/0151725 A1 | 6/2014 | Tseng et al. |
| 2014/0264268 A1 | 9/2014 | Tseng et al. |
| 2014/0291610 A1 | 10/2014 | Tseng et al. |
| 2014/0291611 A1 | 10/2014 | Tseng et al. |
| 2014/0295593 A1 | 10/2014 | Tseng et al. |
| 2016/0076732 A1 | 3/2016 | Kim |
| 2016/0109096 A1 | 4/2016 | Park et al. |
| 2016/0265741 A1* | 9/2016 | Yamada ........... B29D 11/00807 |
| 2016/0351766 A1* | 12/2016 | Hayashi .................. H01L 33/56 |
| 2017/0054064 A1 | 2/2017 | Shichijo et al. |
| 2017/0062671 A1 | 3/2017 | Hashimoto et al. |
| 2017/0084587 A1* | 3/2017 | Hung ...................... H01L 33/60 |

FOREIGN PATENT DOCUMENTS

| | | |
|---|---|---|
| JP | 2007-324220 A | 12/2007 |
| JP | 2010-238846 A | 10/2010 |
| JP | 2011-521480 | 7/2011 |
| JP | 2013-038136 A | 2/2013 |
| JP | 2013-115088 A | 6/2013 |
| JP | 2013-115280 A | 6/2013 |
| JP | 2013-118244 A | 6/2013 |
| JP | 2013115280 A * | 6/2013 |
| JP | 2013-187245 A | 9/2013 |
| JP | 2014-045194 A | 3/2014 |
| JP | 2014-049440 A | 3/2014 |
| JP | 2017-041477 A | 2/2017 |
| JP | 2017-050321 A | 3/2017 |
| KR | 10-2017-0069331 A | 6/2017 |

* cited by examiner

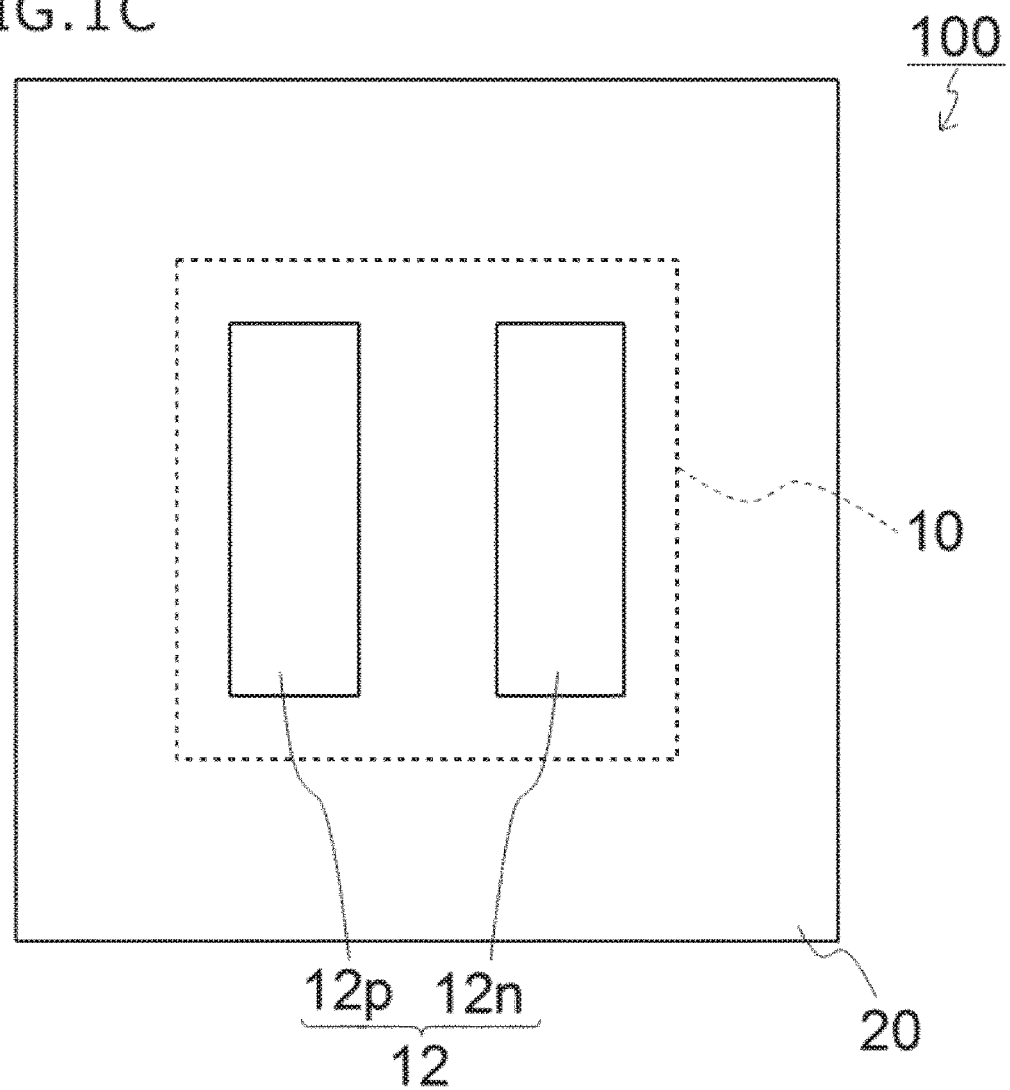

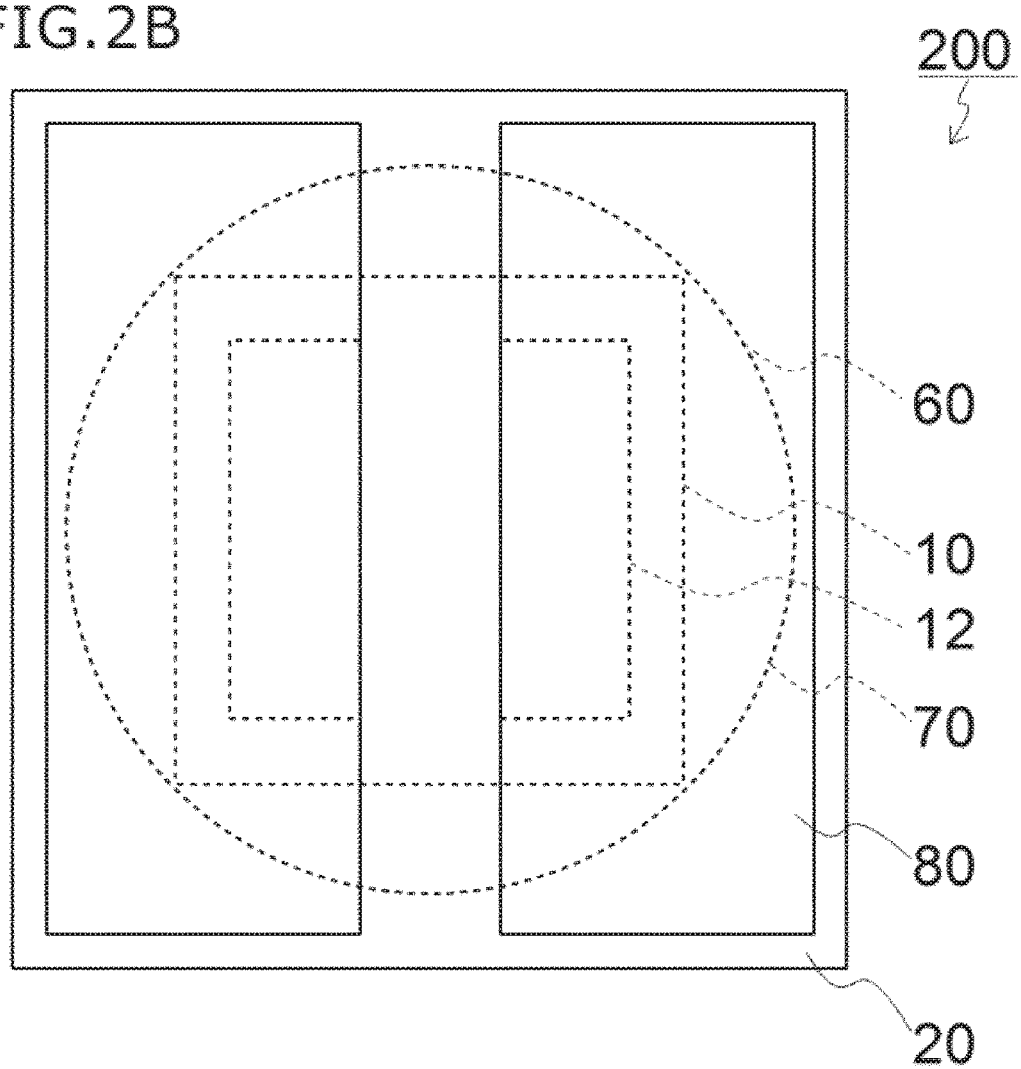

LIGHT EMITTING DEVICE INCLUDING COVERING MEMBER AND OPTICAL MEMBER

CROSS-REFERENCE TO RELATED APPLICATIONS

This application claims priority to Japanese Patent Application No. 2017-125711, filed on Jun. 28, 2017 and Japanese Patent Application No. 2018-100322, filed on May 25, the disclosures of which are hereby incorporated by reference in their entireties.

BACKGROUND

The present disclosure relates to light emitting devices.

There is a known light emitting device in which a reflective resin is provided on an upper surface of a transparent resin for sealing a light emitting element, and thereby light from the light emitting element is radiated to the outside from a side surface of the transparent resin (for example, JP 2013-115280 A). Such a light emitting device easily spreads light in the lateral direction and thus can be used, for example, as a light source for a backlight.

SUMMARY

In recent years, backlights have become thinner. Further, a local dimming system for controlling the brightness of a backlight in conjunction with an image has been widely employed in backlights of the direct-lit type. For this reason, a light emitting device capable of efficiently spreading light in the lateral direction is required.

According to one embodiment of the present disclosure, a light emitting device includes: a light emitting element including a semiconductor multilayer that has an electrode formation surface, a light-emitting surface opposite to the electrode formation surface, and side surfaces between the electrode formation surface and the light-emitting surface, and a pair of electrodes provided on the electrode formation surface; a covering member covering the side surface of the light emitting element; and an optical member disposed over the light-emitting surface of the light emitting element and an upper surface of the covering member, the optical member including a light-reflective portion disposed above the light emitting element and a light-transmissive portion disposed between the light-reflective portion and the covering member and configuring a part of an outer side surface of the light emitting device.

With the configuration described above, the light from the light emitting device can be more efficiently spread in the lateral direction.

BRIEF DESCRIPTION OF DRAWINGS

FIG. 1C is a schematic bottom view showing an example of the light emitting device according to the first embodiment.

FIG. 2B is a schematic bottom view showing an example of the light emitting device according to the second embodiment.

DETAILED DESCRIPTION

Figure 1A:
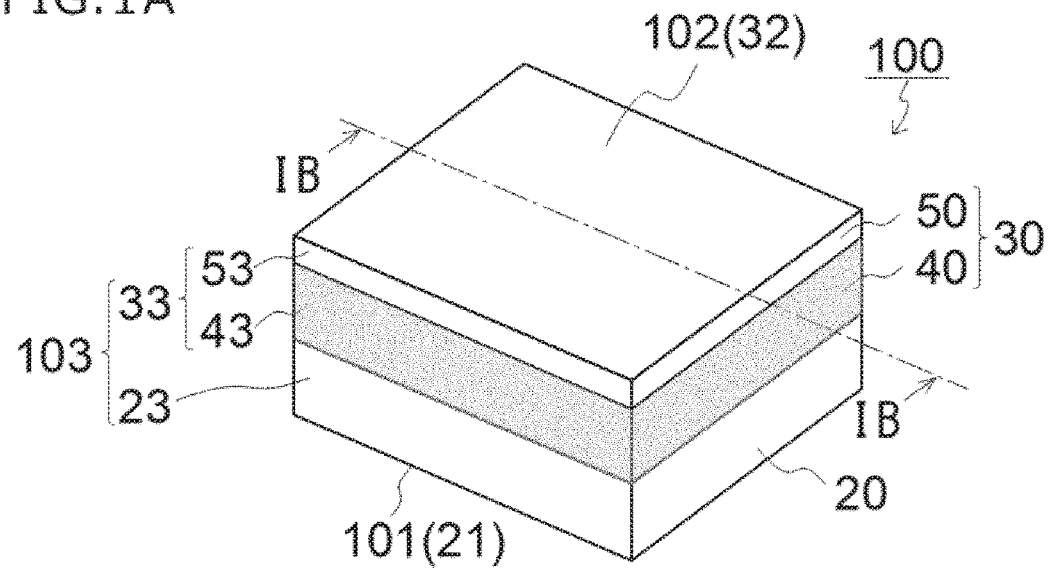
FIG. 1A is a schematic perspective view showing an example of a light emitting device according to a first embodiment.

Embodiments of the present invention will be described in detail below with reference to the accompanying drawings. In the description below, the terms indicative of specific directions or positions (e.g., upper, lower, and other words including these words) are used as needed. The use of these terms is to make the present disclosure easy to understand with reference to the drawings, and does not limit the technical scope of the present invention with their meanings. The same reference characters will be used throughout the drawings to refer to the same or like parts or members. The same members will be described by constantly using the same names, regardless of molding, solidification, and hardening, both before and after singulation. That is, a member that can take different states depending on the step of the process will be constantly described with the same name, for example, when the member is liquid before molding and becomes solid after molding, and further becomes another solid obtained by dividing the solid after molding to change its shape.

A light emitting device according to one embodiment includes a light emitting element, a covering member, and an optical member. The covering member is light-reflective and is disposed to directly or indirectly cover the side surface of the light emitting element. The optical member is a member disposed from above the light emitting element to over the covering member. The optical member has at least a two-layered structure that includes a light-reflective portion and a light-transmissive portion disposed below the light-reflective portion.

The light-reflective portion of the optical member is disposed above the light emitting element. Thus, light from the light emitting element is less likely to be emitted from above (directly above) the light emitting element to the outside. The light-transmissive portion of the optical member is disposed between the light-reflective portion and the covering member. That is, the light-transmissive portion of the optical member forms parts of the side surfaces of the light emitting device. Light from the light emitting element propagates through the light-transmissive portion of the optical member to be emitted to the outside mainly from the side surfaces of the light-transmissive portions.

In this way, light from the light emitting device according to the embodiment is emitted to the outside mainly from the light-transmissive portion, which forms parts of the side surface of the light emitting device. Further, not the entire side surfaces of the light emitting device, but the limited parts of the side surfaces thereof are set as a light-emitting surface of the light emitting device, thereby making it possible to improve the density of the light emitted to the outside. Thus, the light from the light emitting element can be efficiently emitted laterally. For example, when the light emitting device is disposed directly below a light guide plate as a light source for a backlight, the light can be radiated to a wider range.

The respective embodiments will be described in detail below.

First Embodiment

Figure 1B:
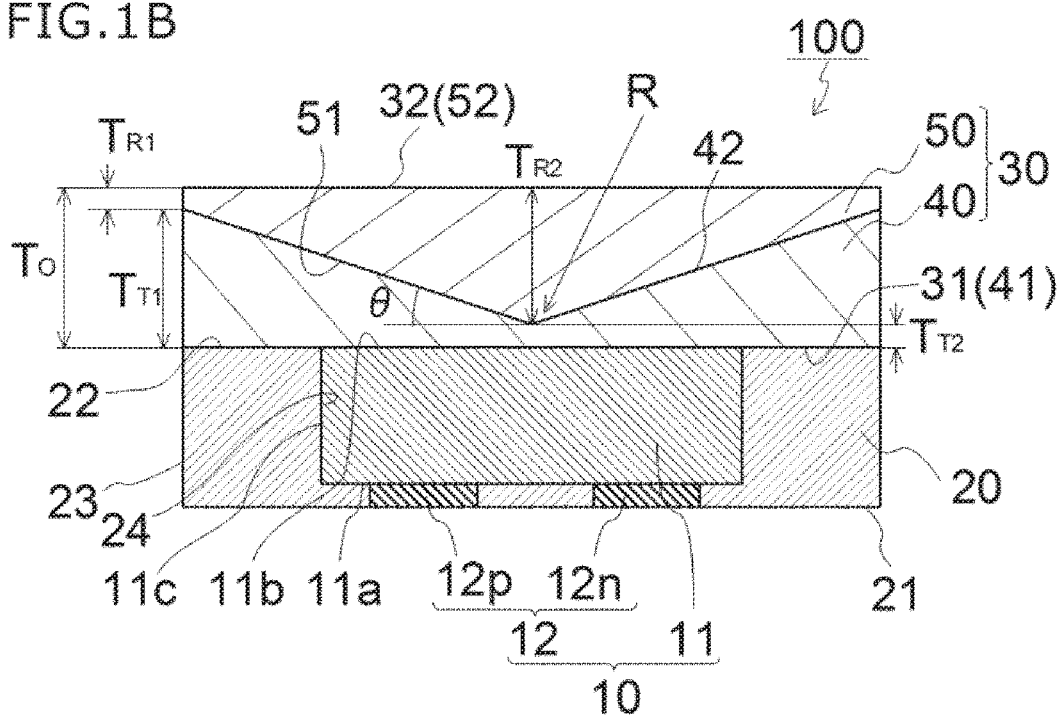
FIG. 1B is a schematic cross-sectional view taken along the line IB-IB of FIG. 1A.

A light emitting device 100 according to a first embodiment is illustrated in FIGS. 1A to 1C. The light emitting device 100 has a substantially rectangular parallelepiped appearance. Each of a lower surface 101 and an upper surface 102 of the light emitting device 100 has a quadrilateral shape, such as a square or rectangular shape. Each of side surfaces 103 of the light emitting device 100 also has a substantially quadrilateral shape. In the side surfaces 103, at least two opposite side surfaces 103 have the same size. The light emitting device is not limited to the above-described shape, and may have a polygonal shape, such as a hexagonal shape, in the top view.

The light emitting device 100 includes a light emitting element 10, a covering member 20, and an optical member 30. The covering member 20 is disposed to cover side surfaces 11c of the light emitting element 10. The optical member 30 is disposed over a light-emitting surface 11b of the light emitting element 10 and an upper surface 22 of the covering member 20.

(Light Emitting Element)

The light emitting element 10 includes a multilayer structure 11 containing semiconductor layers and electrodes 12. The multilayer structure 11 has an electrode formation surface 11a and the light-emitting surface 11b opposite to the electrode formation surface 11a. The electrodes 12 include a positive electrode 12p and a negative electrode 12n. The electrode formation surface 11a of the multilayer structure 11 is also a surface of the light emitting element 10 on which the electrodes are formed. The light-emitting surface 11b of the multilayer structure 11 is also a light-emitting surface of the light emitting element 10.

The multilayer structure 11 includes semiconductor layers including a light-emitting layer. Furthermore, the multilayer structure may include a light-transmissive substrate made of sapphire. An example of the semiconductor multilayer can include three semiconductor layers, namely, a first conductive semiconductor layer (e.g., n-type semiconductor layer), the light-emitting layer (active layer), and a second conductive semiconductor layer (e.g., p-type semiconductor layer). The semiconductor layers that can emit ultraviolet light or visible lights ranging from blue light to green light can be formed, for example, of semiconductor materials, including Group III-V compound semiconductors and the like. Specifically, nitride-based semiconductor materials suitable for use include $In_XAl_YGa_{1-X-Y}N$ ($0 \leq X$, $0 \leq Y$, $X+Y \leq 1$) and the like. Examples of the material of the semiconductor multilayer capable of emitting the red light for use can include, e.g., GaAs, GaAlAs, GaP, InGaAs, InGaAsP, etc. The thickness of the multilayer structure 11 can be set, for example, at 3 μm to 500 μm.

The electrodes 12 can be formed in an arbitrary thickness using the material and structure known in the art. The electrodes 12 can be formed of good electrical conductors. For example, Cu, Ni, Sn, Fe, Ti, Au, Ag, Pt, or the like can be used as the material of the electrode 12. Alternatively, an AuSn solder, a SnAgCu solder, or a SnPb solder may be used as the material of the electrode 12. The electrode 12 can be formed by a single layer of any of these metals or solders, or by a laminate of some of these metals or solders. However, preferably, the electrode 12 is formed by forming a main portion of a Cu, Ni, Fe, or Sn material, which is inexpensive, and covering the outermost surface of the main portion with a stable metal material, such as Au, Ag, or Pt. In this way, the electrode is formed of the main portion made of an inexpensive metal and the stable metal film covering the outermost surface of the main portion. Thus, the electrode 12 can be made at low cost, and additionally, deterioration of the solder wettability due to oxidation can be suppressed. Further, an adhesion layer of Ti, Ni, Mo, W, Ru, Pt, or the like may be formed between the surface layer of Au, Ag, or Pt and the main portion of Cu, Ni, Fe, or Sn. Such an adhesion layer can serve as a base for the surface layer to improve adhesion to the main portion and can control diffusion of solder to reduce voids during solder bonding, thereby maintaining stable strength for a long period of time.

The electrode 12 can be formed to have a thickness of, for example, 1 μm to 300 μm, but preferably in a range of 5 μm to 100 μm, and more preferably in the range of 10 μm to 50 μm. In the case of forming a surface layer of the electrode 12, for example, Au, Ag, Pt, or the like is formed in a thickness of 0.001 μm to 1 μm, preferably 0.01 μm to 0.1 μm. Forming the surface layer in such a thickness range can prevent oxidation of the electrode surface, and can suppress deterioration of the solder wettability thereof, while reducing an increase in cost. The adhesion layer of Ti, Ni, Mo, W, Ru, Pt or the like formed between the surface layer and the main portion is formed to a thickness of, for example, 0.001 to 1 μm, and preferably to a thickness of 0.001 to 0.05 μm. The shape of the electrode 12 in the top view can be selected from various shapes in accordance with the purpose, application, and the like. In FIG. 1C, respective electrodes 12n and 12p have the same shape and are rectangular. The electrodes 12n and 12p can have different shapes to show polarities. For example, the electrode can have any shape that is formed by partially cutting out any side or corner of the rectangle. The lower surface of the electrode 12 is exposed from the covering member 20, and can function as an external connection terminal. Here, only the lower surfaces of the electrodes 12 are exposed from the covering member 20 by way of example. However, a part or all of the side surfaces of the electrodes 12 may be exposed from the covering member 20.

(Coating Member)

The covering member 20 is light-reflective and directly or indirectly covers the side surfaces 11c of the light emitting element 10. In other words, each inner side surface 24 of the covering member 20 is in contact with or faces the corresponding side surface 11c of the light emitting element 10. In the light emitting device 100 exemplified in FIG. 1B, the covering member 20 is in contact with the side surfaces 11c of the light emitting element 10.

Outer side surfaces 23 of the covering member 20 form side surfaces 103 of the light emitting device 100, together with side surfaces 33 of the optical member 30 to be described later. The outer side surfaces 23 of the covering member 20 are preferably flush with the side surface 33 of the optical member 30.

The covering member 20 covers the electrode formation surface 11a of the multilayer structure 11 so as to expose at least a part of each of a pair of electrodes 12p and 12n in the light emitting element 10. Specifically, the covering member 20 exposes the lower surfaces of the electrodes 12p and 12n and covers the side surfaces of the electrodes 12p and 12n. A lower surface 21 of the covering member 20 forms a part of the lower surface 101 of the light emitting device 100. In the light emitting device 100 shown in FIG. 1B, the lower surface 21 of the covering member 20 is flush with the lower surface of each electrode 12. A part of the covering member 20 that covers the lower surface of the multilayer structure is formed to have the same thickness as the thickness of the electrode 12, for example, in the range of 5 to 100 μm, and preferably 10 to 50 μm such that the lower surface 21 of the covering member 20 is flush with the lower surface of the electrode 12. Covering the lower surface of the multilayer structure with the covering member having a thickness in such a range can reduce the light emitted from the lower surface of the multilayer structure (or can suppress light leakage). The thickness of the covering member that covers the lower surface of the multilayer structure can be appropriately set in consideration of, for example, the concentration of the $TiO_2$ contained in the covering member. As described above, for example, the lower surface 21 of the covering member 20 and the lower surface of the electrode 12 are located on the same plane, but in the present embodiment, any step may be provided between the lower surface of the electrode 12 and the lower surface 21 of the covering member 20. In that case, the lower surface of the electrode 12 may be protruded from the lower surface 21 of the covering member 20, or may be recessed. The step formed between the lower surface of the electrode 12 and the lower surface 21 of the covering member 20 is, for example, in the range of 0.1 to 30 μm, preferably 0.5 to 20 μm, and more preferably 0.5 to 10 μm, in order to secure stable connection therebetween that has a high connection strength and a low connection resistance. For example, when the electrode 12 is formed to protrude from the lower surface 21 of the covering member 20, the solder can also be bonded to the side surface of a protruding portion, so that the bonding strength between the solder and the electrode can be increased. Alternatively, when the electrode 12 is formed so that the lower surface of the electrode 12 is recessed with respect to the lower surface 21 of the covering member 20, the light emitting device can be suppressed from being tilted when being mounted, which can reduce variations in the orientation direction between the light emitting devices after mounting.

An upper surface 22 of the covering member 20 is in contact with a lower surface 31 of the optical member 30. In the light emitting device 100 shown in FIG. 1B, the upper surface 22 of the covering member 20 is flush with the light-emitting surface 11b of the light emitting element 10.

The covering member 20 is a member capable of reflecting light from the light emitting element 10 and can be formed using a resin material that contains, for example, light-reflective material. The covering member 20 preferably has a reflectance of 70% or more for light from the light emitting element 10, more preferably 80% or more, and even more preferably 90% or more.

The covering member 20 preferably includes, as a base material, a resin material that mainly contains a thermosetting resin, such as a silicone resin, a modified silicone resin, an epoxy resin, and a phenol resin. The usable light-reflective material contained in the resin material can be, for example, a white material. Specifically, examples of such a material include titanium oxides, silicon oxides, zirconium oxides, potassium titanates, aluminum oxides, aluminum nitrides, boron nitrides, and mullites. As the light-reflective material, granular, fibrous, sheet-like ones, and the like can be used.

(Optical Member)

Figure 1D:
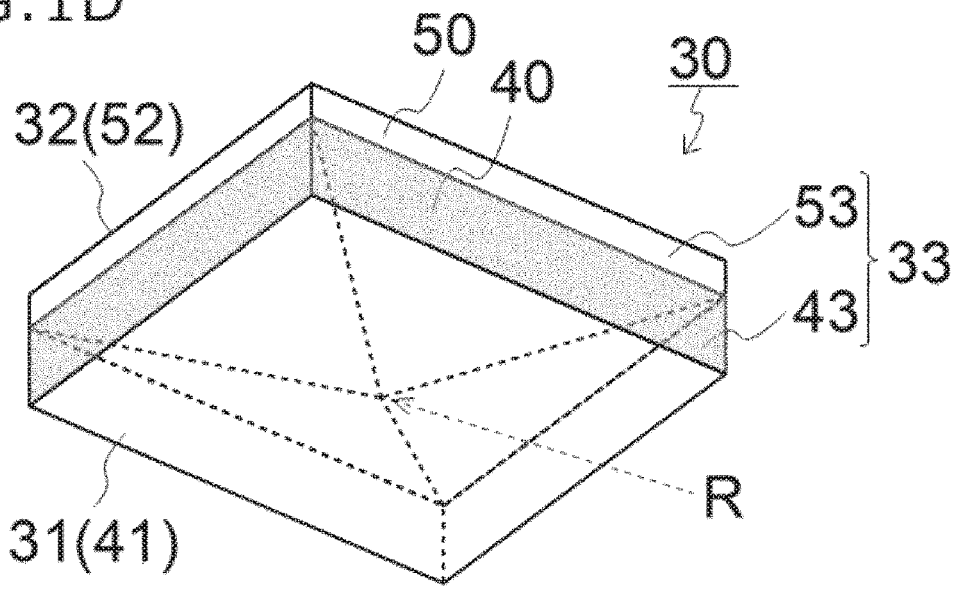
FIG. 1D is a schematic perspective view showing an example of an optical member in the light emitting device according to the first embodiment.

The optical member 30 is a member for controlling the light distribution properties of the light emitting device 100. FIG. 1D is a schematic perspective view of the optical member 30 in the light emitting device 100 shown in FIG. 1A as viewed from the lower surface side. The optical member 30 is a plate-like member disposed over the light-emitting surface 11b of the light emitting element 10 and the upper surface 22 of the covering member 20. The optical member 30 has a two-layered structure at least in the vertical direction, and includes a light-reflective portion 50 on its upper side and a light-transmissive portion 40 on its lower side. An upper surface 52 of the light-reflective portion 50 is the upper surface 32 of the optical member 30, and is also the upper surface 102 of the light emitting device 100. Side surfaces 53 of the light-reflective portion 50 are parts of the side surfaces 33 of the optical member 30, and are also parts of the side surfaces 103 of the light emitting device 100. Side surfaces 43 of the light-transmissive portion 40 are parts of the side surfaces 33 of the optical member 30, and are also parts of the side surfaces 103 of the light emitting device 100. A lower surface 41 of the light-transmissive portion 40 is a part or whole of the lower surface 31 of the optical member 30 and is a surface facing at least the upper surface 22 of the covering member 20.

In the first embodiment, the light-transmissive portion 40 is disposed not only above the covering member 20, but also above the light emitting element 10. In other words, the lower surface 41 of the light-transmissive portion 40 faces the light-emitting surface 11b of the light emitting element 10. Thus, the light-emitting surface 11b of the light emitting element 10 and the lower surface 51 of the light-reflective portion 50 are disposed to face each other via the light-transmissive portion 40. Thus, the light emitted from the light emitting element 10 can be efficiently reflected by using the lower surface 51 of the light-reflective portion 50 to be easily extracted from the light-emitting surfaces, located on the sides of the light emitting device, to the outside.

A thickness $T_O$ of the optical member 30 can be set to be the same over the entire optical member 30. That is, both the lower surface 31 and the upper surface 32 of the optical member 30 are planar and can be in parallel with each other. By making the upper surface 32 of the optical member 30 flat as shown in FIG. 1B, for example, when the light emitting device is transported by suction with a collet or the like, the light emitting device can be sucked with high accuracy. It is noted that the upper surface 32 and the lower surface 31 of the optical member 30 may have surfaces that are not partially or entirely parallel to each other. The thickness $T_O$ of the optical member 30 can be appropriately selected according to the size of the light emitting element 10, the size of the light emitting device 100, the light distribution properties of the light emitting device 100, and the like. For example, the thickness $T_O$ of the optical member 30 can be approximately 20% to 80% of the thickness of the light emitting device 100.

(Light-Transmissive Portion of Optical Member)

The light-transmissive portion 40, which is disposed on the side of the lower surface 31 of the optical member 30, is a member for propagating light from the light emitting element 10. The light-transmissive portion 40 can be formed using a light-transmissive resin material, glass, or the like. For example, thermosetting resins, such as silicone resins, modified silicone resins, epoxy resins, and phenol resins can be used as the material of the light-transmissive portion. Alternatively, thermoplastic resins, such as polycarbonate resins, acrylic resins, methylpentene resins, and polynorbornene resins, can also be used as the material of the light-transmissive portion. In particular, silicone resins are preferable because they have excellent resistance to light and heat. The light-transmissive portion 40 preferably has a transmittance of 70% or more for light from the light emitting element, more preferably 80% or more, and even more preferably 90% or more. The light-transmissive portion 40 does not substantially contain a phosphor described later. Further, the light-transmissive portion 40 does not contain a diffusion material or the like. The light-transmissive portion 40 is formed only of the above-described resin or glass. This configuration suppresses the light from being scattered within the light-transmissive portion 40, so that the light reflected by the lower surface 51 of the light-reflective portion 50 and the upper surface 22 of the covering member 20 can be efficiently emitted to the outside from the side surfaces 43 of the light-transmissive portion 40.

The side surfaces 43 of the light-transmissive portion 40 are surfaces that emit light from the light emitting element 10 to the outside, and serve as the light-emitting surfaces of the light emitting device 100. As shown in FIGS. 1A and 1B, the side surfaces 43 of the light-transmissive portion 40 are disposed on all the four side surfaces 103 of the rectangular light emitting device 100. That is, the light emitting device 100 has the light-emitting surfaces on the four side surfaces 103. Thus, the light emitting device 100 has the light-emitting surface expanding in a direction of 360 degrees around the light emitting device 100 as the center in the top view.

In this way, by using, as the light-emitting surfaces, the side surfaces of the light-transmissive portion 40 vertically sandwiched between the covering member 20 and the light-reflective portion 50 on the side surfaces 103 of the light emitting device 100, the light from the light emitting element 10 can be emitted to the outside from the light-emitting surfaces, each having a small area, compared to the thickness of the light emitting device 100. Thus, the light laterally emitted from the light emitting device 100 can be radiated farther.

In the flat plate-shaped optical member 30 having the constant thickness as a whole, each of the light-transmissive portion 40 and the light-reflective portion 50 can have its own constant thickness. That is, each of the light-transmissive portion 40 and the light-reflective portion 50 can be formed in a flat plate shape. However, preferably, as shown in FIG. 1B, regarding the thickness of the light-transmissive portion 40 in the cross-sectional view, the thickness $T_{T1}$ at the side surface 43 thereof is larger than the thickness $T_{T2}$ at the center thereof. The thickness $T_{T1}$ at the side surface 43 of the light-transmissive portion 40 can be set to 50% to 100% of the thickness $T_O$ of the optical member 30. That is, the thickness $T_{T1}$ at the side surfaces 43 of the light-transmissive portion 40 may be the same as the thickness $T_O$ of the optical member. The thickness $T_{T2}$ at the center of the light-transmissive portion 40 can be set to 0% to 90% of the thickness $T_O$ of the optical member 30. That is, at the center of the light-transmissive portion 40, the thickness $T_{R2}$ of the light-reflective portion 50 may be the same as the thickness $T_O$ of the optical member 30.

(Light-Reflective Portion of Optical Member)

The light-reflective portion 50 of the optical member 30 is a member for reflecting the light from the light emitting element 10 toward the side surfaces 43 of the light-transmissive portion 40 as the light-emitting surface. The light-reflective portion 50 can be formed, for example, using a metal material or a resin material containing a light-reflective material. Alternatively, the light-reflective portion 50 can be made of a multilayer dielectric film formed using inorganic materials. The light-reflective portion 50 preferably has a reflectance of 70% or more for the light from the light emitting element, more preferably 80% or more, and more preferably 90% or more.

When a light-reflective resin material composed of a resin material with the light-reflective material dispersed therein is used as the light-reflective portion 50, the usable light-reflective material can be, for example, a white material. Examples of such a material include titanium oxides, silicon oxides, zirconium oxides, potassium titanates, aluminum oxides, aluminum nitrides, boron nitrides, and mullites. As the light-reflective material, granular, fibrous, sheet-like ones, and the like can be used. For example, thermosetting resins, such as silicone resins, modified silicone resins, epoxy resins, and phenol resins, can be used as the base material.

When a metal material having a high optical reflectance is used as the light-reflective portion 50, examples of the metal material can include silver, aluminum, rhodium, gold, copper, etc., and an alloy thereof, or may be one or more combination thereof.

When a multilayer dielectric film is used as the light-reflective portion 50, examples of the light-reflective portion 50 can include titanium oxides, silicon oxides, zirconium oxides, potassium titanates, aluminum oxides, aluminum nitrides, and the like.

The light-reflective portion 50 includes a lower surface 51 functioning as a reflection surface that reflects light incident into the light-transmissive portion 40. The lower surface 51 of the light-reflective portion 50 can be set parallel to the light-emitting surface 11b of the light emitting element 10. Preferably, the lower surface 51 can be a convex surface that protrudes toward the light-emitting surface 11b. Thus, the light from the light emitting element 10 can be easily reflected in the direction toward the light-emitting surface positioned on each side surface of the light emitting device (each side surface 43 of the light-transmissive portion 40).

Further, when the lower surface 51 of the light-reflective portion 50 is a convex surface, a vertex R of the light-reflective portion 50, which is located closest to the light-emitting surface 11b of the light emitting element 10, is preferably disposed to coincide with the center of the light emitting element 10 in the top view. Thus, the light from the light emitting element 10 can be easily radiated uniformly from all the light-emitting surfaces at the side surfaces of the light emitting device to the outside.

The light-reflective portion 50 preferably has a thickness at which the transmittance of light from the light emitting element 10 is approximately 50% or less. As shown in FIG. 1B, when the light-reflective portion 50 is a member that has parts with different thicknesses, the thinnest part of the light-reflective portion 50 preferably has a thickness at which the transmittance of light from the light emitting element 10 is smaller than approximately 50%.

When the optical member 30 has a flat plate shape, regarding the thickness of the light-reflective portion 50, the thickness $T_{R1}$ at the side surface 53 thereof is preferably thinner than the thickness $T_{R2}$ at the vertex R thereof located at the center.

When a resin material containing a light-reflective material or the like is used as the light-reflective portion 50, the light transmittance of the light-reflective portion 50 varies depending on the composition, content, and the like of the light-reflective material. Thus, the thickness of the light-reflective portion 50 or the like is appropriately adjusted depending on the material used. For example, suppose that the light-reflective portion 50 using a resin material containing about 70 wt % of titanium oxide has a thick center and a thin side surfaces 53 as shown in FIG. 1B. In this case, the thickness $T_{R1}$ at each side surface 53 of the light-reflective portion 50 is preferably from 0 μm to 300 μm, and more preferably from 20 μm to 100 μm, whereas the thickness $T_{R2}$ at the center of the light-reflective portion 50 is preferably, for example, from 20 μm to 500 μm, and more preferably from 50 μm to 300 μm.

The thickness $T_{R2}$ at the vertex R of the light-reflective portion 50 may be the same as the thickness $T_O$ of the optical member 30. That is, the optical member 30 may include a region where the light-transmissive portion 40 does not exist in the thickness direction of the optical member 30.

The lower surface 51 of the light-reflective portion 50 can have a conical shape. For example, as shown in FIG. 1B, the light-reflective portion 50 preferably has a conical shape that has its center as the vertex R and an inclined surface that is inclined from the vertex R to the side surface 53. The inclined surface may form a straight line in the cross-sectional view as shown in FIG. 1B. In this case, an angle Θ of the inclined surface (angle from a horizontal surface) is preferably, for example, 10 degrees to 80 degrees, and more preferably 20 degrees to 60 degrees.

A modified example of the light-reflective portion 50 will be described later.

Second Embodiment

Figure 2A:
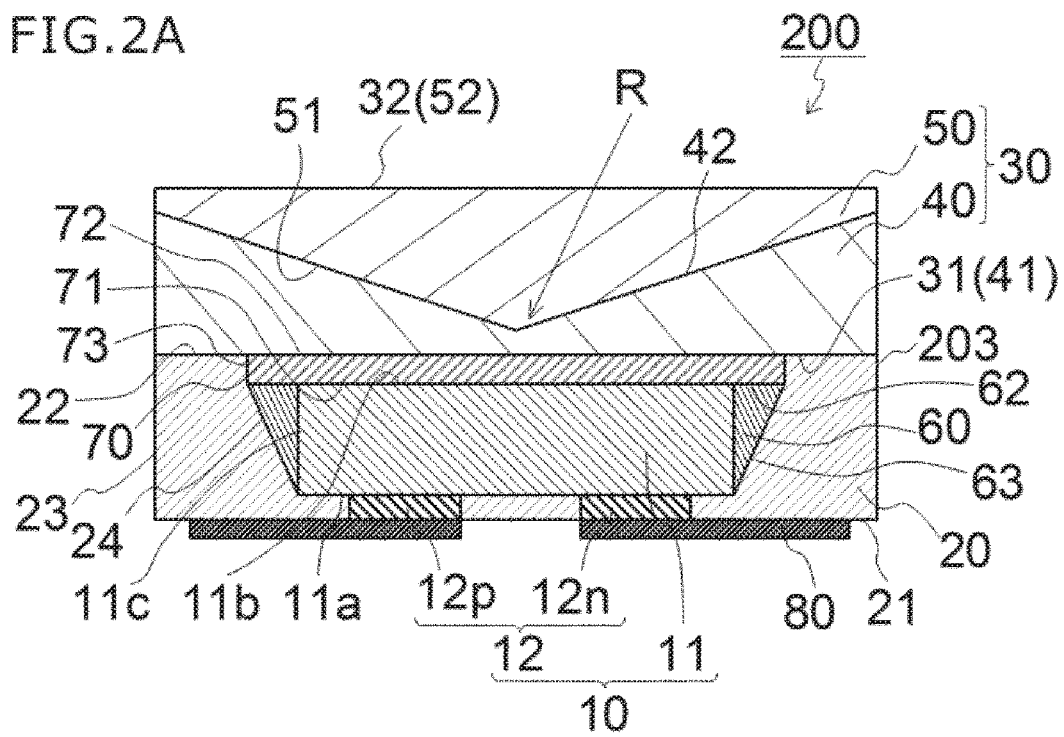
FIG. 2A is a schematic cross-sectional view showing an example of a light emitting device according to a second embodiment.

A light emitting device 200 according to a second embodiment is shown in FIGS. 2A and 2B. The light emitting device 200 has the similar appearance and shape as the light emitting device 100 shown in FIG. 1A, and differs from the light emitting device 100 of the first embodiment in that it includes a light guide member 60, a wavelength conversion member 70, and a metal layer 80. The light emitting device 200 may include all of the light guide member 60, the wavelength conversion member 70, and the metal layer 80, or may include one or two of them. Hereinafter, the light guide member 60, the wavelength conversion member 70, and the metal layer 80 will mainly be described. The structures of other components in the second embodiment are the same as those in the first embodiment, and hence a description thereof will be omitted as appropriate.

(Light Guide Member)

A light guide member 60 is a member disposed to cover the side surfaces 11c of the light emitting element 10, and configured to guide light emitted from the side surfaces 11c of the light emitting element 10 to the optical member 30. The light guide member 60 can be formed using a light-transmissive resin material. For example, the resin material preferably contains a thermosetting resin, such as a silicone resin, a silicone modified resin, an epoxy resin, or a phenol resin as a main component. The light guide member 60 preferably has a transmittance of 70% or more for light from the light emitting element, more preferably 80% or more, and even more preferably 90% or more.

The light guide member 60 preferably covers 50% or more of each side surface 11c of the light emitting element 10. The light guide member 60 may cover the light-emitting surface 11b of the light emitting element 10. Outer side surfaces 63 of the light guide member 60 are covered with the covering member 20. Thus, the light emitted from the side surfaces 11c of the light emitting element 10 is incident into the light guide member 60, then reflected upward by the outer side surface 63 of the light guide member 60 (in the direction of each light-emitting surface 11b of the light emitting element 10), and is eventually incident into the light-transmissive portion 40 of the optical member 30. By providing such a light guide member 60, the light from the light emitting element 10 can be efficiently incident on the light-transmissive portion 40 of the optical member 30.

The upper surface 62 of the light guide member 60 is connected to the lower surface 31 of the optical member 30 so as to be optically continuous directly or indirectly. Specifically, the upper surface 62 of the light guide member 60 is optically connected directly or indirectly to the lower surface 41 of the light-transmissive portion 40 of the optical member 30. The light emitting device 200 shown in FIG. 2A includes a wavelength conversion member 70 between the light-emitting surface 11b of the light emitting element 10 and the lower surface 31 of the optical member 30. The upper surface 62 of the light guide member 60 is in contact with the lower surface 71 of the wavelength conversion member 70. As the wavelength conversion member 70 is a light-transmissive member as described later, the light emitted from the side surfaces 11c of the light emitting element 10 is incident into the light guide member 60, then into the wavelength conversion member 70, and eventually into the light-transmissive portion 40 of the optical member 30. That is, the light guide member 60 and the optical member 30 are optically indirectly continuous to each other via the wavelength conversion member 70 disposed therebetween. Thus, when the wavelength conversion member 70 is provided, the light guide member 60 and the optical member 30 are preferably connected together via the wavelength conversion member 70 interposed therebetween.

As shown in the bottom view of FIG. 2B, the outer shape of the upper surface 62 of the light guide member 60 can be set substantially circular. The light guide member 60 having such a shape can be provided by forming the liquid light guide member 60 on the flat plate-shaped optical member 30 through potting or the like in a method for manufacturing a light emitting device described later.

(Wavelength Conversion Member)

The wavelength conversion member 70 contains a phosphor that absorbs light from the light emitting element 10 and then converts it into light having a different wavelength. The wavelength conversion member 70 is disposed between the light-emitting surface 11b of the light emitting element 10 and the lower surface 31 of the optical member 30. Specifically, the wavelength conversion member 70 is disposed between the light-emitting surface 11b of the light emitting element 10 and the lower surface 41 of the light-transmissive portion 40 in the optical member 30. The wavelength conversion member 70 is disposed between the light emitting element 10 and the light-transmissive portion 40, whereby the mixed light of the light from the light emitting element 10 and the light from the wavelength conversion member 70 is incident on the light-transmissive portion 40. The light guide member 60 may be disposed between the wavelength conversion member 70 and the light emitting element 10.

As shown in FIG. 2A and the like, the wavelength conversion member 70 preferably covers the entire light-emitting surface 11b of the light emitting element 10. In other words, the width (area) of each of a lower surface 71 and an upper surface 72 of the wavelength conversion member 70 is preferably larger than the width (area) of the light-emitting surface 11b of the light emitting element 10. When the light guide member 60 is provided on the side surfaces 11c of the light emitting element 10, the wavelength conversion member 70 preferably covers the entire light-emitting surface 11b of the light emitting element 10 and the entire upper surfaces 62 of the light guide members 60. In other words, the width of each of the lower surface 71 and the upper surface 72 of the wavelength conversion member 70 is preferably larger than the width (area) obtained by adding the width (area) of the light-emitting surface 11b of the light emitting element 10 to the width (area) of the upper surface 62 of the light guide member 60. The lower surface 71 and the upper surface 72 of the wavelength conversion member 70 can have the same size or different sizes. Each of the side surfaces 73 of the wavelength conversion member 70 may be a vertical surface, an inclined surface, a curved surface, or the like.

Preferably, the outer shape (outer shape in the top view) of the wavelength conversion member 70 is geometrically similar to the outer shape of the light emitting surface of the light emitting element 10. In this way, the light emitting element 10 and the wavelength conversion member 70 are disposed such that the central axis of the light emitting surface of the light emitting element 10 substantially coincides with the central axis of the wavelength conversion member 70. Thus, the width of an outer peripheral part of the wavelength conversion member 70, positioned outside the light-emitting surface of the light emitting element 10, can be constant, thus suppressing unevenness in color. That is, if the width of the outer peripheral part of the wavelength conversion member 70 positioned outside the light emitting surface of the light emitting element 10 is not constant, the amount of light wavelength-converted by the wavelength conversion member 70 may vary depending on the direction, which might cause unevenness in color. However, by making the width of the outer peripheral part of the wavelength conversion member 70 constant, unevenness in color can be suppressed.

The side surface 73 of the wavelength conversion member 70 is preferably spaced apart from a side surface 203 of the light emitting device 200. In other words, the width (area) of each of the first surface 71 and the second surface 72 of the wavelength conversion member 70 is preferably smaller than the width (area) of a surface of the light emitting device 200 positioned on the side of the light-emitting surface 11b. The shape of the wavelength conversion member 70 in the top view can be a quadrilateral shape, a circular shape, a polygonal shape, or the like. The thickness of the wavelength conversion member 70 can be appropriately selected according to the type and amount of a phosphor to be used, the target chromaticity, and the like. For example, the thickness of the wavelength conversion member 70 can be 20 µm to 200 µm, preferably 40 µm to 180 µm, and more preferably 60 µm to 150 µm.

Further, the wavelength conversion member 70 may be formed by a plurality of layers containing different types of phosphors. By containing different types of phosphors in the plurality of layers, mutual absorption between the phosphors can be suppressed to improve wavelength conversion efficiency, which can produce the light-emitting device with high light output. For example, when the wavelength conversion member 70 is formed by two layers, the thickness of each layer is set to, for example, 10 µm to 100 µm, and more preferably in a range of 40 µm to 80 µm.

The wavelength conversion member 70 includes a base material, such as a light-transmissive resin material or glass, and a phosphor as a wavelength conversion material. For example, thermosetting resins, such as silicone resins, modified silicone resins, epoxy resins, and phenol resins can be used as the base material. Alternatively, thermoplastic resins, such as polycarbonate resins, acrylic resins, methylpentene resins, and polynorbornene resins, can be used as the base material. In particular, silicone resins are preferable because they have excellent resistance to light and heat. The base material preferably has a transmittance of 70% or more for the light from the light emitting element, more preferably 80% or more, and even more preferably 90% or more.

The phosphor is used to absorb light from the light emitting element 10 and then convert it into light having a different wavelength. In other words, the phosphor is used that can be excited with the light emitted from the light emitting element 10. Examples of the phosphor that can be excited with the light from a blue light emitting element or an UV light emitting element can include: an yttrium aluminum garnet based phosphor activated with cerium (YAG:Ce); a lutetium aluminum garnet based phosphor activated with cerium (LAG:Ce); a nitrogen-containing calcium aluminosilicate based phosphor ($CaO—Al_2O_3—SiO_2$) activated with europium and/or chromium; a silicate based phosphor (($Sr, Ba)_2SiO_4$) activated with europium; nitride based phosphors, such as β sialon phosphors, CASN based phosphors, and SCASN based phosphors; KSF based phosphors ($K_2SiF_6$:Mn); sulfide based phosphors; and quantum-dot phosphors. The combination of these phosphors and one of the blue light emitting element or UV light emitting element can produce light emitting devices for various colors (e.g., a white based light emitting device). These phosphors can be used alone or in combination. When these phosphors are used in combination, the phosphors may be mixed together or stacked on each other.

Further, the wavelength conversion member may contain various fillers or the like for the purpose of adjusting the viscosity of the material for the wavelength conversion member and the like.

(Metal Layer)

Metal layers 80 are conductive members and can function as external connection terminals of the light emitting device 200.

The respective metal layers 80 are electrically connected to the electrodes 12n and 12p of the light emitting element 10. The metal layers 80 can be disposed to cover parts of the lower surface 21 of the covering member 20. In other words, on the lower surface of the light emitting device 200, the metal layers 80 can be disposed from the electrodes 12 of the light emitting element 10 to over the lower surface 21 of the covering member 20. Consequently, at the lower surface of the light emitting device 200, each metal layer 80 can be exposed to the outside as the external connection terminal in such a manner as to have a larger area than the area of each electrode 12 of the light emitting element 10. By setting the area of the metal layer 80 larger than the corresponding electrode 12 of the light emitting element 10, when being intended to be mounted onto a wiring board or the like by solder or the like, the light emitting device 200 can be mounted with high positioning accuracy. In addition, the joining strength between the wiring board and the light emitting device 200 can be improved.

Material selected for the metal layer 80 is preferably one having excellent resistance to corrosion and oxidation, compared to the electrodes 12 of the light emitting element 10. The metal layer 80 may be formed of only a single layer of a material, or may be formed of a multilayer obtained by laminating different material layers. Particularly, the metal material having a high melting point is preferably used for the metal layer. Examples of the metal material include Ru, Mo, and Ta. Such a high-melting point metal material is provided between the electrode and a layer positioned at the outermost surface of the light emitting element, whereby the metal layer can serve as a diffusion prevention layer that can reduce the diffusion of Sn contained in solder into the electrode of the light emitting element or a layer close to the electrode. For example, the multilayer structure including the diffusion prevention layer includes Ni/Ru/Au, Ti/Pt/Au, or the like. The thickness of the diffusion prevention layer (made of, e.g., Ru) is preferably approximately 10 Å to 1000 Å.

The thickness of the metal layer 80 can be selected from various potential thicknesses. The thickness of the metal layer 80 can be set, for example, at 10 nm to 3 µm. Here, when a plurality of metal layers is laminated to form the metal layer 80, the term "thickness of the metal layer 80" refers to the total thickness of the plurality of layers.

The metal layer 80 can have a size reaching the side surface 203 at the bottom surface of the light emitting device 200. In addition, the metal layer 80 can have a size that makes the metal layer 80 spaced apart from the side surface 203 at the bottom surface of the light emitting device 200. The metal layers 80 can have the same shape, the same size, or different shapes and sizes in the bottom view. For example, a notch or the like may be provided on one of the metal layers 80 respectively connected to the electrode 12n and the electrode 12p so as to function as a cathode mark, an anode mark, or the like.

Third Embodiment

Figure 3A:
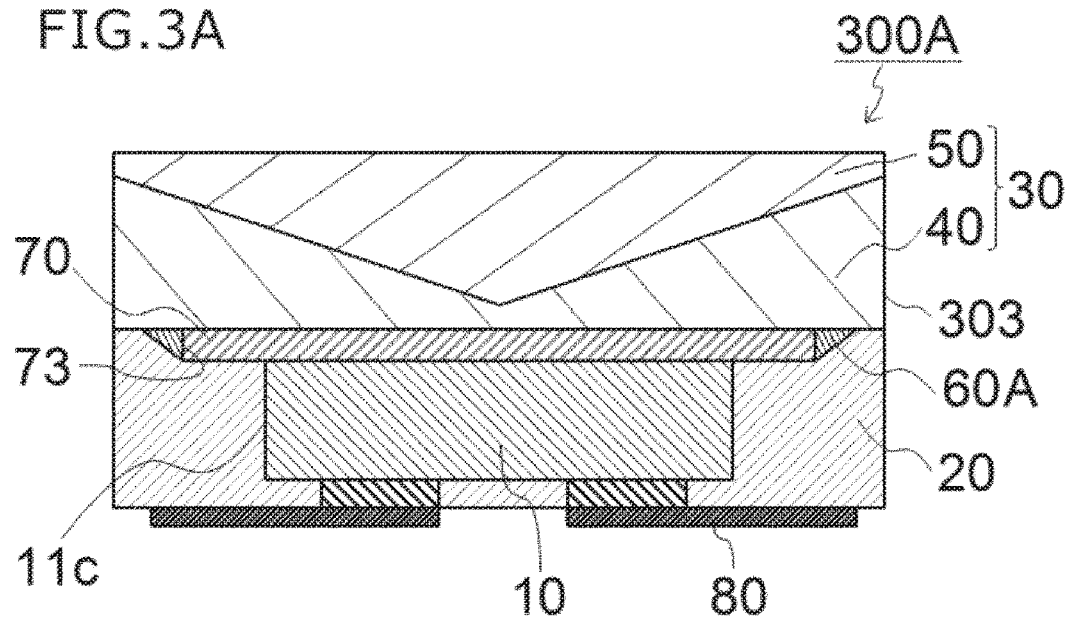
FIG. 3A is a schematic cross-sectional view showing an example of a light emitting device according to a third embodiment.
Figure 3B:
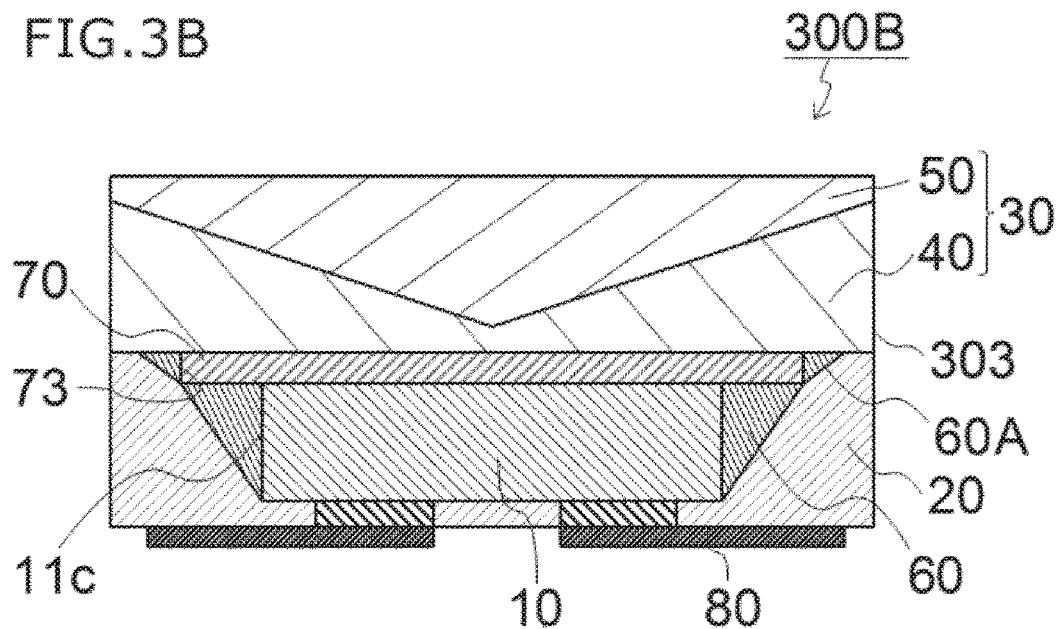
FIG. 3B is a schematic cross-sectional view showing a modified example of the light emitting device according to the third embodiment.

A light emitting device according to a third embodiment is illustrated in FIGS. 3A and 3B. Each of a light emitting device 300A and a light emitting device 300B has substantially the same outer appearance and shape as those of the light emitting device 100 or the like shown in FIG. 1A. While in the above-described second embodiment, the light guide member 60 is disposed on each side surface 11c of the light emitting element 10, in the third embodiment, a light guide member 60A is disposed on each side surface 73 of the wavelength conversion member 70, which is a different point between the second and third embodiments.

In the light emitting device 300B, the light guide member 60 is disposed on each side surface of the light emitting element 10, and a light guide member 60A is disposed on each side surface of the wavelength conversion member 70. In such a case, the light guide member 60 and the light guide member 60A are preferably disposed not to be optically continuous to each other. If the light guide member 60 and the light guide member 60A are optically continuous to each other, the light not passing through the wavelength conversion member 70 would be incident into the light-transmissive portion 40. This might cause unevenness in color of the display device, which is not preferable.

The light guide member 60A disposed on the side surface 73 of the wavelength conversion member 70 is preferably disposed so as to be spaced apart from the side surface 303 of each of the light emitting device 300A, 300B. In other words, the light guide member 60A is preferably embedded in the covering member 20. Also, in examples shown in FIGS. 3A and 3B, the metal layers 80 are provided, but are not essential.

Modified Examples of Optical Member

Light emitting devices shown in FIGS. 4A to 4E are modified example of the optical member exemplified in the first to third embodiments. Here, the light emitting device that includes a wavelength conversion member, a light guide member, a metal layer, and the like is exemplified, but these members are not indispensable.

The optical structures shown in FIGS. 4A to 4E have in common that the lower surface of the light-reflective portion is convex downward at the center.

Figure 4A:
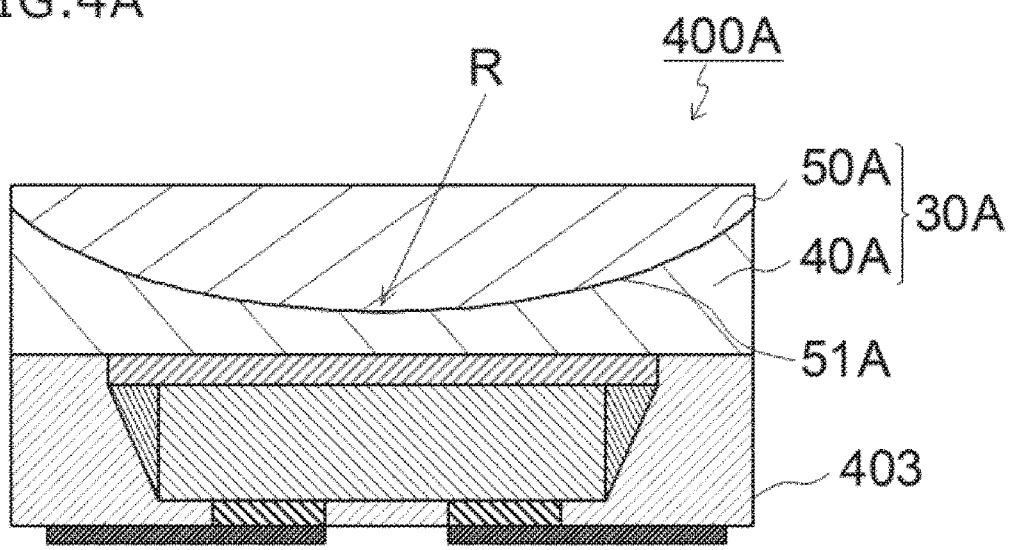
FIG. 4A is a schematic cross-sectional view showing a modified example of the light emitting device according to any one of the first to third embodiments.

In a light emitting device 400A shown in FIG. 4A, a light-reflective portion 50A of the optical member 30A has its lower surface 51A formed as a curved surface. That is, the lower surface 51A can be a hemispherical or parabolic-mirror-like surface. The lower surface 51A of the light-reflective portion 50A has a part near its center serving as the vertex R, which is located closest to the light emitting element 10. The vertex R is a curved surface, and the lower surface 51B between the vertex R and the side surface 403 of the light emitting device 400A is a curved surface that becomes convex toward the side surface.

Figure 4B:
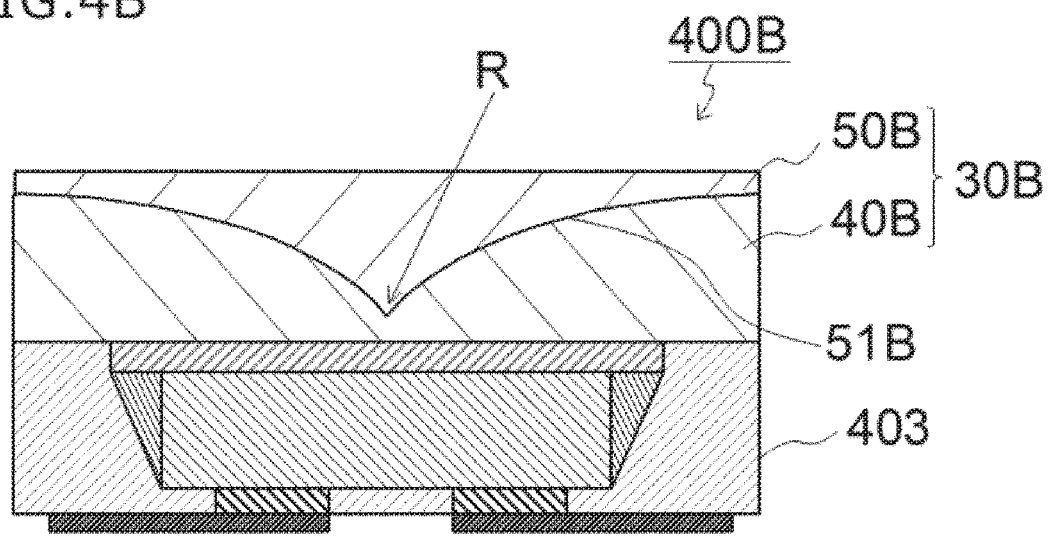
FIG. 4B is a schematic cross-sectional view showing another modified example of the light emitting device according to any one of the first to third embodiments.

In the light emitting device 400B shown in FIG. 4B, the lower surface 51B of the light-reflective portion 50B in the optical member 30B has a shape that makes curved surfaces convex toward the upper surface side thereof with the vertex R sandwiched therebetween, i.e., has a shape formed by modifying a conical shape. Specifically, the lower surface 51B of the light-reflective portion 50B is a concave curved surface with respect to the side surface 403 of the light emitting device 400B. As shown in FIG. 4B, by making the concave curved surface with respect to the side surface 403 as the reflection surface, in the light emitting device 400B, the light can be spread farther away than the light emitting device 400A shown in FIG. 4A.

Further, by forming the lower surface of the light-reflective portion as a curved surface shown in FIGS. 4A and 4B, the orientation of the light can be controlled while reducing the loss of brightness, compared to the light-reflective portion having an inclined surface that is planar in the cross-sectional view as shown in FIG. 1B and the like. When the lower surface of the light-reflective portion is a curved surface, the curvature of the curved surface is set, for example, in a range of 1/(length L of the wavelength conversion member×0.5) to 1/(length L of the wavelength conversion member×20), preferably 1/(length L of the wavelength conversion member) to 1/(length L of the wavelength conversion member×10). By forming the curved surface in this range, light can be effectively reflected in the lateral direction, which can produce the light emitting device with high light output.

Here, the term "length L of the wavelength conversion member" refers to a diagonal length when the outer shape of the wavelength conversion member is rectangular, and refers to a diameter when the outer shape of the wavelength conversion member is circular.

Figure 4C:
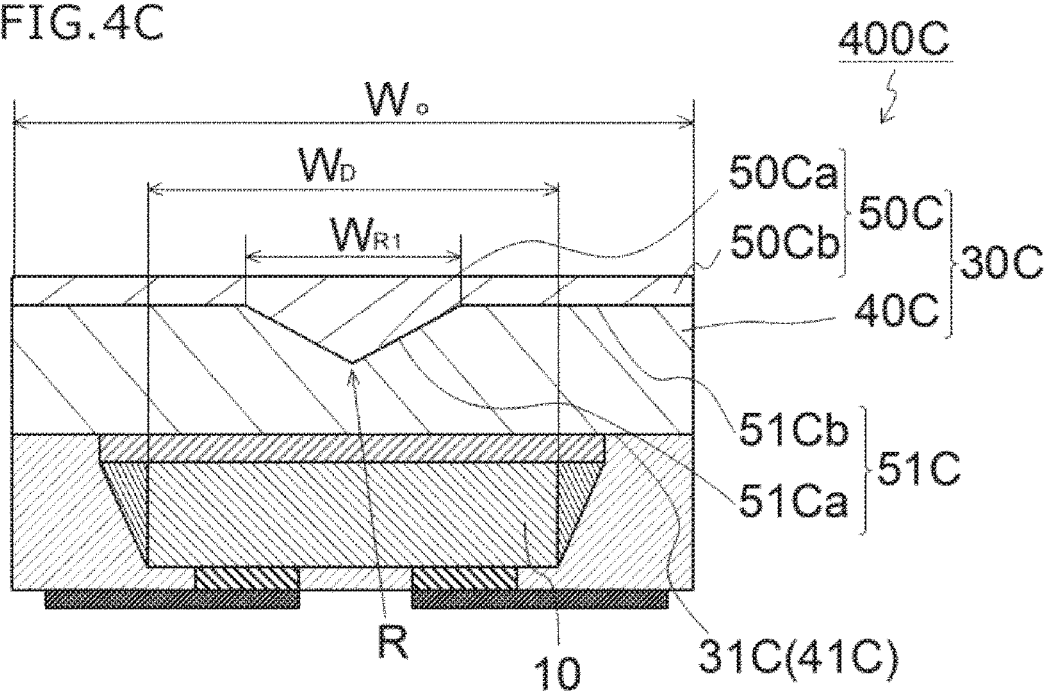
FIG. 4C is a schematic cross-sectional view showing another modified example of the light emitting device according to any one of the first to third embodiments.

In a light emitting device 400C shown in FIG. 4C, a light-reflective portion 50C of an optical member 30C includes a convex portion 50Ca in the vicinity of the center of the lower surface 51C, and a planar portion 50Cb around the convex portion 50Ca. That is, the entire lower surface 51 of the light-reflective portion 50 in the optical member 30 shown as the example in FIG. 1B and the like is an inclined surface or a curved surface, whereas the lower surface 51C of the light-reflective portion 50C shown in FIG. 4C has a lower surface 51Ca of the convex portion 50Ca located in the vicinity of the center thereof, which is a part of the lower surface, and formed as an inclined surface. Here, the lower surface 51Ca of the convex portion 50Ca is an inclined surface that forms a straight line in the cross-sectional view by way of example, but is not limited to this, and may be a lower surface 51Ca that includes a convex curved surface shown in FIGS. 4A and 4B or a concave curved surface.

The convex portion 50Ca of the light-reflective portion 50C is disposed above the light emitting device 10. The convex portion 50Ca is preferably disposed in the vicinity of the center of the optical member 30C. Further, the vertex R of the convex portion 50Ca preferably coincides with the center of the wavelength conversion member 70 in the top view. Because the light propagates in the wavelength conversion member 70, as long as the center of the wavelength conversion member 70 coincides with the center of the convex portion 50Ca, the light can be easily spread uniformly, even though the center of the light emitting element 10 slightly deviates from the center of the convex portion 50Ca. The width $W_{R1}$ of the convex portion 50Ca in the light-reflective portion 50C shown in FIG. 4C is set smaller than the width $W_D$ of the light emitting element 10. The width of the convex portion is not limited thereto, and the width $W_{R1}$ of the convex portion 50Ca may be the same as or larger than the width $W_D$ of the light emitting element 10 according to the required light distribution.

The planar portion 50Cb of the light-reflective portion 50C has a surface parallel to the lower surface 31C of the optical member 30C (lower surface 41C of a translucent portion 40C). In this region, the light-reflective portion 50C has a constant thickness.

Figure 4D:
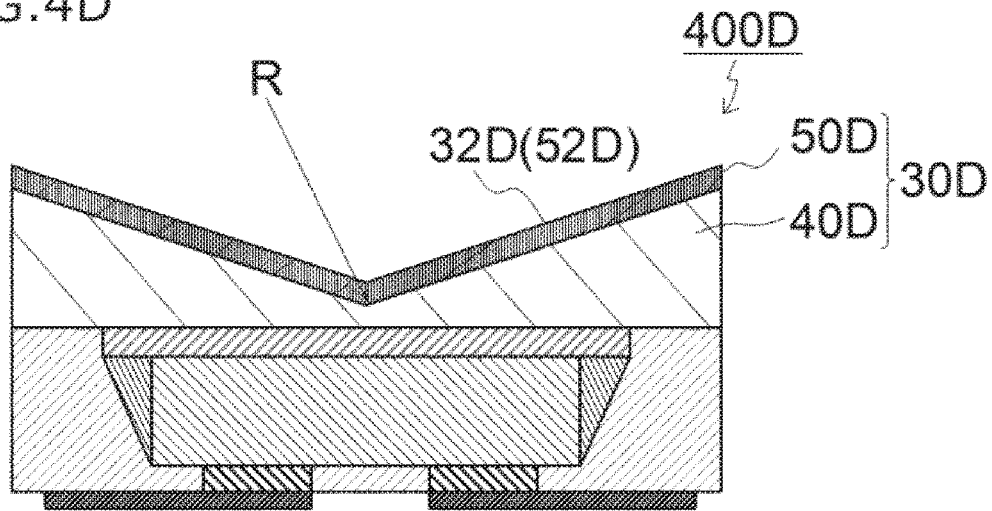
FIG. 4D is a schematic cross-sectional view showing another modified example of the light emitting device according to any one of the first to third embodiments.
Figure 4E:
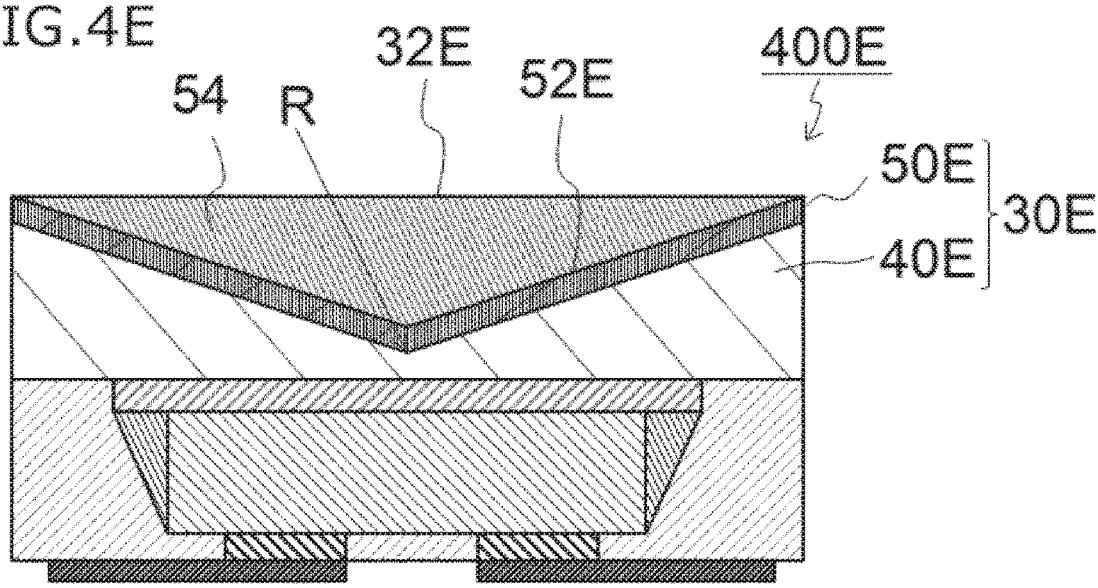
FIG. 4E is a schematic cross-sectional view showing another modified example of the light emitting device according to any one of the first to third embodiments.

In a light emitting device 400D shown in FIG. 4D, an upper surface 32D of an optical member 30D (i.e., the upper surface 52D of the light-reflective portion 50D) has a concave shape. The light-transmissive portion 40D of the light emitting device 400D has the same shape as the light-transmissive portion 40 of the light emitting device 100 shown in FIG. 1B, but differs from the light emitting device 100 in the shape of the upper surface 52D of the light-reflective portion 50D. Furthermore, the light-reflective portion 50D is formed in the same thickness throughout. For example, when a metal film, an insulating reflective film, or the like, formed by sputtering and the like, is used as the light-reflective portion 50D, the light-reflective portion 50D can be formed to have the same thickness as a whole in this way. The light-reflective portion 50D shown in FIG. 4D may have a lower surface that includes a convex curved surface as shown in FIGS. 4A and 4B or a concave curved surface.

In the case of the light-reflective portion that has its upper surface formed in a concave shape as shown in FIG. 4D, a filling member, such as a resin material, may be further provided on the light-reflective portion. For example, in a light emitting device 400E shown in FIG. 4E, a light-reflective portion 50E has its upper surface 52E formed in a concave shape. A filling member 54 is disposed on the upper surface 52E of the concave light-reflective portion 50E. The upper surface of the filling member 54 becomes the upper surface 32E of the optical member 30E. In this way, the upper surface 52E of the light-reflective portion 50E may be different from the upper surface 32E of the optical member 30E. By making the upper surface of the filling member 54 flat, for example, the light emitting device can be easily sucked with a collet or the like. The light-reflective portion 50E shown in FIG. 4E may also have a lower surface that includes a convex curved surface as shown in FIGS. 4A and 4B or a concave curved surface.

<Manufacturing Method>

A method for manufacturing a light emitting device in any one of the first to third embodiments will be described with reference to FIGS. 5A to 5H. Here, a method of manufacturing the light emitting device according to the second embodiment will be described by way of example. That is, a description will be given on a method for manufacturing a light emitting device that includes a light guide member, a wavelength conversion member, a metal layer, and the like. In order to obtain a light emitting device that does not include one or some of these members, the step of forming the member not included will be omitted.

(Providing Light-Reflective Portion)

Figure 5A:
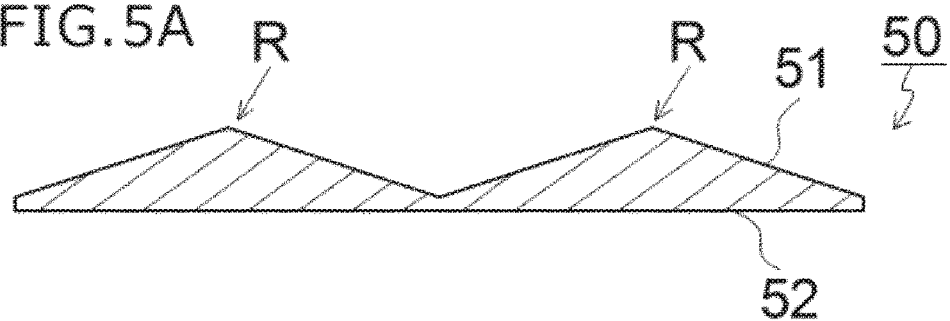
FIG. 5A is a diagram showing a step in a method for manufacturing the light emitting device according to any one of the first to third embodiments.

As shown in FIG. 5A, first, the light-reflective portion 50 is provided. The light-reflective portion 50 is a plate-shaped member. The light-reflective portion 50 has a first surface 51 that has a convex portion and a second surface 52 that is a flat surface. One light-reflective portion 50 can include one or more convex portions. Here, the light-reflective portion 50 including two convex portions will be described by way of example. As shown in FIG. 5A, the first surface 51 is disposed on the upper side, whereas the second surface 52 is disposed on the lower side. The first surface 51 is a surface corresponding to the lower surface 41 of the light-reflective portion 50 in the light emitting device 100, and the second surface 52 is a surface corresponding to the upper surface 52 of the light-reflective portion 50 in the light emitting device 100. Because in some manufacturing steps, as shown in FIG. 5A and the like, the state of the light emitting device is turned upside down, for convenience of description, the first surface and the second surface are denoted, instead of the lower surface and the upper surface.

The light-reflective portion 50 may be provided by purchasing a light-reflective portion 50 with the above-described shape, or may be prepared through a process, such as molding, using the following materials.

The case of forming the light-reflective portion 50 using a light-reflective resin material, which has been obtained by dispersing a light-reflective material in the resin material, will be described below. The light-reflective portion 50 made of a light-reflective resin material can be formed by a method, such as injection molding, transfer molding, or compression molding, using a mold, a die, and the like. Alternatively, a plate-shaped member shown in FIG. 5A may be prepared using another resin material or the like, and a light-reflective layer may be formed on the first surface 51, which is a reflection surface for reflecting light from the light emitting element, by a method, such as injection molding, transfer molding, or compression molding, in the same manner as described above, or by printing, spraying, sputtering, or the like, to thereby form the light-reflective portion 50.

The case of forming the light-reflective portion 50 using a metal material will be described below. In the case of using the metal member, the entire light-reflective portion 50 may also be formed of the metal material that has a high optical reflectance. In this case, the light-reflective portion having a convex shape on its one side can be formed by applying processing, such as grinding or bending, onto a metal plate as shown in FIG. 5A. Alternatively, the light-reflective portion may be formed by preparing the plate-shaped member having a shape shown in FIG. 5A from the resin material or the like described above, and then forming a plating film made of a metal material with a high optical reflectance by plating or the like on the first surface 51, which serves as the reflection surface that reflects the light from the light emitting element.

The case of using a multilayer dielectric film as the light-reflective portion 50 will be described below. The light-reflective portion 50 may be formed by preparing the plate-shaped member having a shape shown in FIG. 5A from the resin material or the like described above, and then forming a multilayer dielectric film by sputtering or the like on the first surface 51, which serves as the reflection surface that reflects the light from the light emitting element.

(Formation of Light-Transmissive Portion)

Figure 5B:
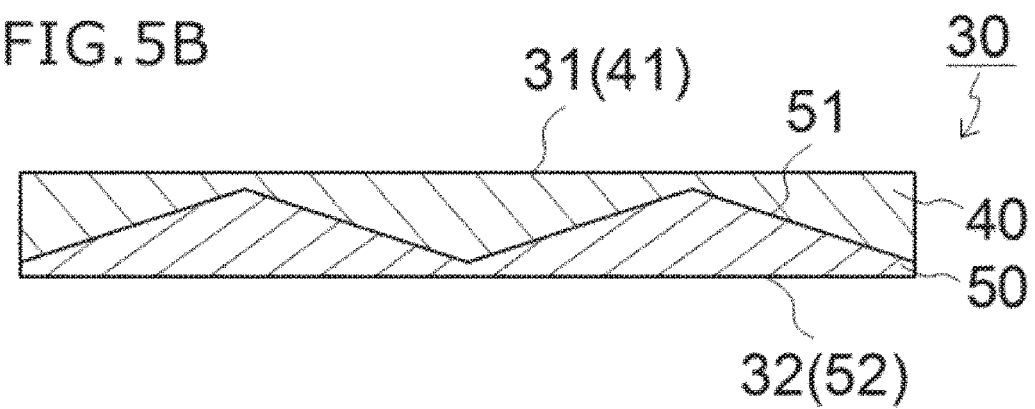
FIG. 5B is a diagram showing another step in the method for manufacturing the light emitting device according to any one of the first to third embodiments.

Then, as shown in FIG. 5B, the light-transmissive portion 40 is formed on the first surface 51 of the light-reflective portion 50. Consequently, the flat plate-shaped optical member 30 can be obtained such that the first surface 41 of the light-transmissive portion 40 becomes the first surface 31 of the optical member 30, while the second surface 52 of the light-reflective portion 50 becomes the second surface 32 of the optical member 30. The light-transmissive portion 40 can be formed, for example, by arranging the above-described light-reflective portion 50 in a mold, and then molding a light-transmissive resin material on the light-reflective portion 50 by a method, such as injection molding, transfer molding, compression molding, or the like. Alternatively, the light-transmissive portion 40 can be formed by forming a light-transmissive resin material on the first surface 51 of the light-reflective portion 50 by printing coating, spray coating, or the like. Because the first surface 41 of the light-transmissive portion 40 becomes a surface on which the light emitting element is placed in a later step, the first surface 41 is preferably a flat surface.

Providing Optical Member: Modified Example

The optical member 30 can be providing by providing the light-reflective portion 50 as described above, and then forming the light-transmissive portion 40 thereon. Alternatively, the optical member 30 may be formed by first preparing the light-transmissive portion 40 and then forming the light-reflective portion 50. In particular, when a metal film or a multilayer dielectric film is used as the light-reflective portion 50, preferably, the light-transmissive portion 40 is first prepared, and then the light-reflective portion 50 is formed on the first surface of the light-transmissive portion 40 by using a film formation method or the like. Such a light-transmissive portion 40 may be provided by purchasing one.

(Formation of Wavelength Conversion Member)

Figure 5C:
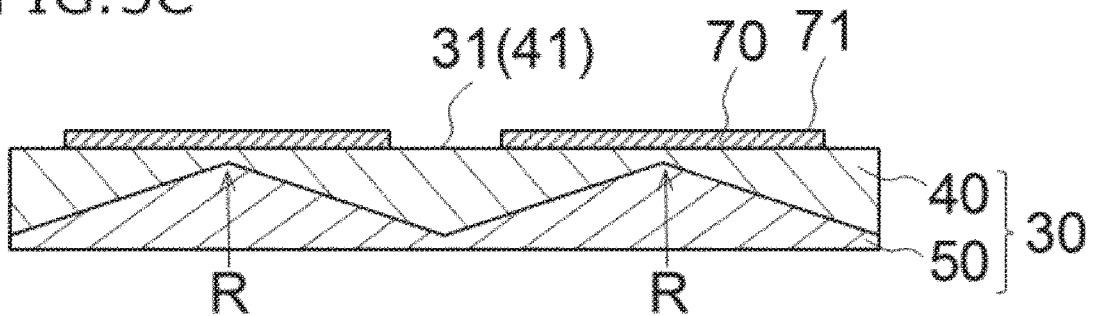
FIG. 5C is a diagram showing another step in the method for manufacturing the light emitting device according to any one of the first to third embodiments.

Then, as shown in FIG. 5C, the wavelength conversion members 70 are disposed on the first surface 31 of the optical member 30 (the first surface 41 of the light-transmissive portion 40). It is noted that this step is omitted in a manufacturing process for a light emitting device that does not include a wavelength conversion member.

The wavelength conversion members 70 are respectively disposed on the first surface 31 of the optical member 30 (on the first surface 31 of the light-transmissive portion 40), in positions facing the vertexes R of the respective convex portions in the light-reflective portion 50. The adjacent wavelength conversion members 70 are spaced apart from each other between the vertexes R. The center of the wavelength conversion member 70 is preferably disposed to coincide with the vertex R of the light-reflective portion 50.

Each of the wavelength conversion members 70 can be provided by preparing a molded product and then arranging the product on the first surface 31 of the optical member 30 using an adhesive or the like. When an adhesive is used, as shown in FIG. 3A and the like, the light guide members 60A can be formed by disposing an adhesive on the respective side surfaces 73 of the wavelength conversion member 70.

The wavelength conversion members 70 can be formed on the first surface 31 of the optical member 30 using a liquid resin material containing a phosphor in a resin material by printing, spraying, injection molding, compression molding, transfer molding, or the like. For example, a mask or the like with desired shaped openings formed in regions facing the vertexes R of the light-reflective portion is provided on the first surface 31 of the optical member 30 in advance, and the material of the wavelength conversion members 70 is then arranged in the openings, followed by removal of the mask, so that the wavelength conversion members 70 can be formed to be spaced apart from each other. Alternatively, a wavelength conversion member 70 is formed on the entire first surface 31 of the optical member 30, and then other regions of the wavelength conversion member 70, excluding regions facing the vertexes R of the light-reflective portion, are removed to leave parts of the wavelength conversion member 70 in a desired shape in the regions facing the vertexes R of the light-reflective portion. In this way, the wavelength conversion members 70 can also be formed to be spaced apart from each other. Alternatively, the wavelength conversion members 70 may be formed by potting a liquid resin material on the first surface 31 of the optical member 30 using a dispense nozzle or the like without using a mask.

The first surface 71 of the wavelength conversion member 70 becomes a surface on which the light emitting element is placed in a later step. For this reason, the first surface 71 of the wavelength conversion member 70 preferably has at least a flat surface on which the light emitting element can be placed.

(Formation of Light Guide Member)

Figure 5D:
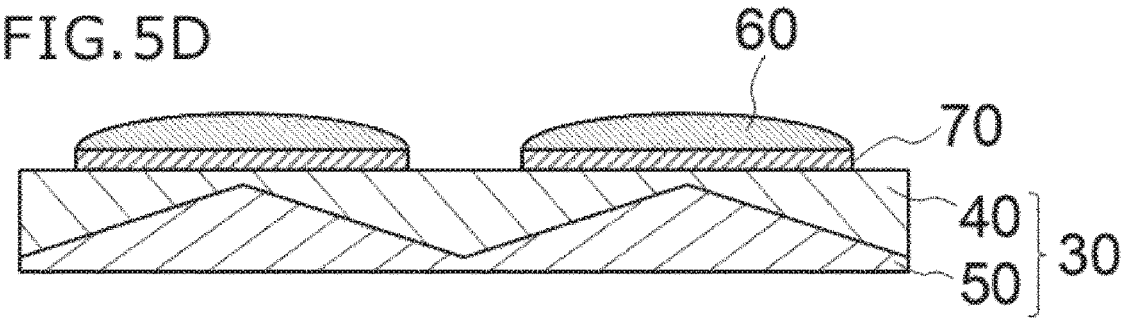
FIG. 5D is a diagram showing another step in the method for manufacturing the light emitting device according to any one of the first to third embodiments.

Then, as shown in FIG. 5D, the light guide member 60 is disposed on the first surface 31 of the optical member 30. When the wavelength conversion members 70 are disposed on the first surface 31 of the optical member 30, the light guide member 60 is disposed on the first surface 71 of each wavelength conversion member 70. It is noted that as the light guide member 60 disposed here is in a liquid state and functions as a joining member for joining a light emitting element described later to the optical member 30 or the wavelength conversion member 70, the light guide member 60 preferably has a deformable hardness. The size of the light guide member 60 disposed on each side surface of the light emitting element can be adjusted by the amount of the liquid light guide member 60. Thus, the amount of the light guide member 60 is preferably adjusted depending on the size or height of the light emitting element, and the like. When the liquid light guide member 60 is disposed on the first surface 71 of each wavelength conversion member 70, the amount of the light guide member 60 is preferably adjusted such that the size of the light guide member 60 becomes smaller than the area of the first surface 71 of the corresponding wavelength conversion member 70. In a step of forming the liquid wavelength conversion members 70 before this step, the light emitting element may be placed before curing the liquid wavelength conversion member 70. That is, the liquid wavelength conversion member 70 itself may be used as a joining member. In such a case, the step of forming the light guide member can be omitted. This step of forming the light guide member can be omitted when an adhesive is applied to the side of the light emitting element, or when the optical member and the light emitting element are directly joined together.

(Placing of Light Emitting Element)

Figure 5E:
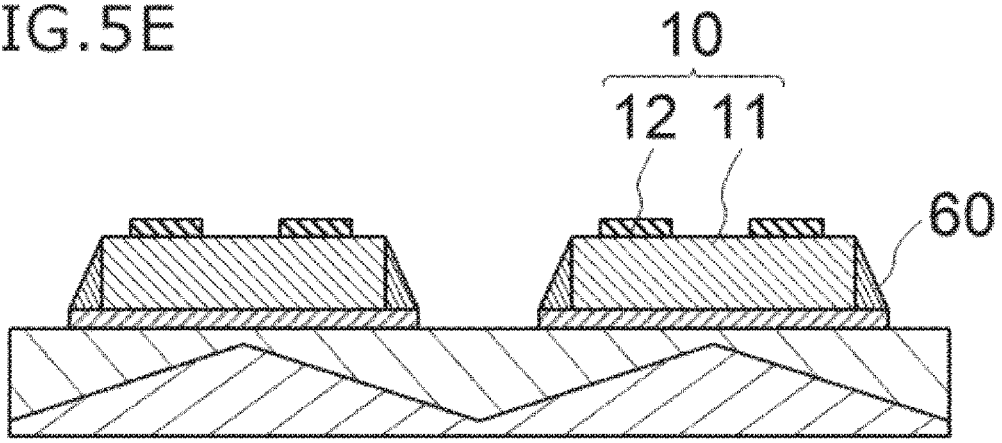
FIG. 5E is a diagram showing another step in the method for manufacturing the light emitting device according to any one of the first to third embodiments.

Then, as shown in FIG. 5E, the light emitting elements 10 are disposed on the light guide members 60. Each light emitting element 10 is disposed such that the electrodes 12 are positioned on the upper side, that is, such that the side surfaces of the multilayer structure 11 face the light guide member 60. When the light guide member 60 is in a liquid state, the liquid light guide member 60 creeps up to each of the side surfaces of the light emitting element 10, whereby as shown in FIG. 5E, the fillet-shaped light guide member 60 is formed. In this state, the light guide member 60 is cured.

(Formation of Coating Member)

Figure 5F:
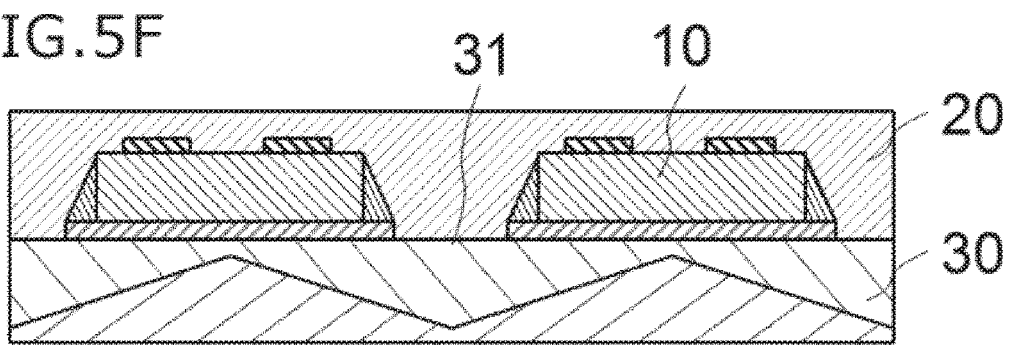
FIG. 5F is a diagram showing another step in the method for manufacturing the light emitting device according to any one of the first to third embodiments.

Then, as shown in FIG. 5F, the covering member 20 is formed over the optical member 30 to integrally cover a plurality of light emitting elements 10. The covering member 20 can be formed up to the height at which the electrodes 12 of each light emitting element 10 are embedded therein. The covering member 20 is also formed to embed the first surface 31 of the optical member 30 disposed between the adjacent light emitting elements 10. The covering member 20 can be formed by, for example, injection molding, transfer molding, compression molding, printing, potting, spraying, or the like.

(Exposure of Electrodes)

Figure 5G:
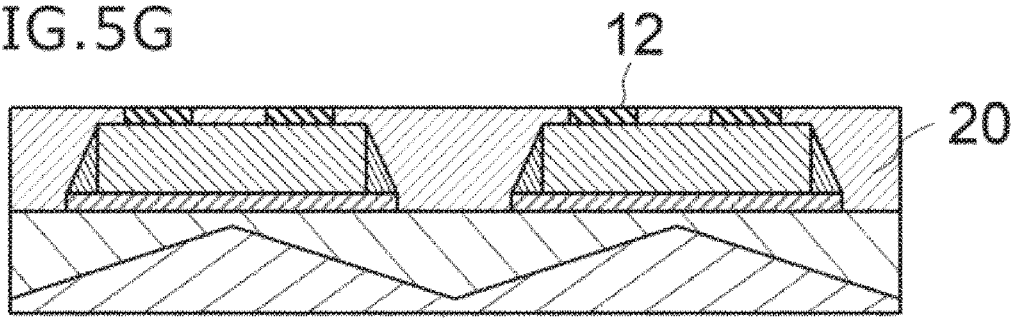
FIG. 5G is a diagram showing another step in the method for manufacturing the light emitting device according to any one of the first to third embodiments.

Then, as shown in FIG. 5G, parts of the covering member 20 are removed to expose the electrodes 12 of the light emitting elements 10. This step is necessary after the covering member 20 is formed to embed the electrodes 12 as described above. That is, when the covering member 20 is formed not to have the upper surfaces of the electrodes 12 embedded therein, this step is omitted. Suitable methods for removing a part of the covering member 20 can include polishing, grinding, blasting, and the like.

Figure 5H:
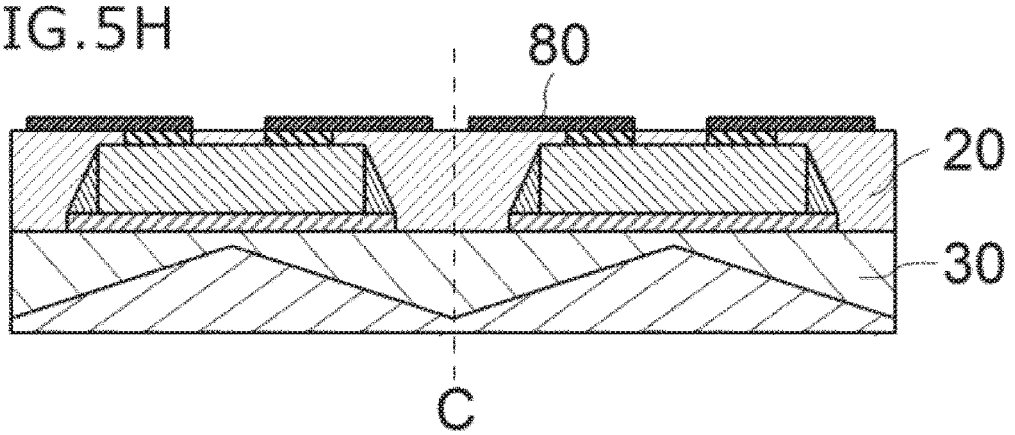
FIG. 5H is a diagram showing another step in the method for manufacturing the light emitting device according to any one of the first to third embodiments.

Then, as shown in FIG. 5H, the metal layers 80 are formed on a pair of exposed electrodes 12. The metal layers 80 may cover the covering member 20. The metal layer 80 can be formed by sputtering, vapor deposition, an atomic layer deposition (ALD) method, a metal organic chemical vapor deposition (MOCVD) method, a plasma-enhanced chemical vapor deposition (PECVD) method, an atmospheric pressure plasma deposition method, plating, etc.

Each metal layer 80 can be formed by first forming a metal layer to cover the entire surfaces including the covering member 20 and electrodes 12, and then patterning the metal film, for example, by irradiation with a laser beam, etching, and the like. Alternatively, the metal layers 80 can be formed by first forming a patterned mask or the like on the covering member and electrodes in advance, and then depositing the metal layer 80 thereon by the above-described method, followed by removal of the mask. Alternatively, when the metal layers 80 are formed by laser ablation through irradiation with a laser beam, the thickness of each metal layer 80 can be, for example, 10 nm to 3 µm, and is preferably 1 µm or less, and more preferably 1000 A or less.

Further, the thickness of the metal layer 80 is preferably, for example, 5 nm or more, in order to reduce corrosion of the electrodes 12.

(Singulation Step)

Finally, the covering member 20 and the optical member 30 are cut and singulated between the adjacent light emitting elements (along a cutting line indicated by a dashed line C shown in FIG. 5I1), which can produce the light emitting devices 200 shown in FIG. 2A.

Fourth Embodiment

Figure 6:
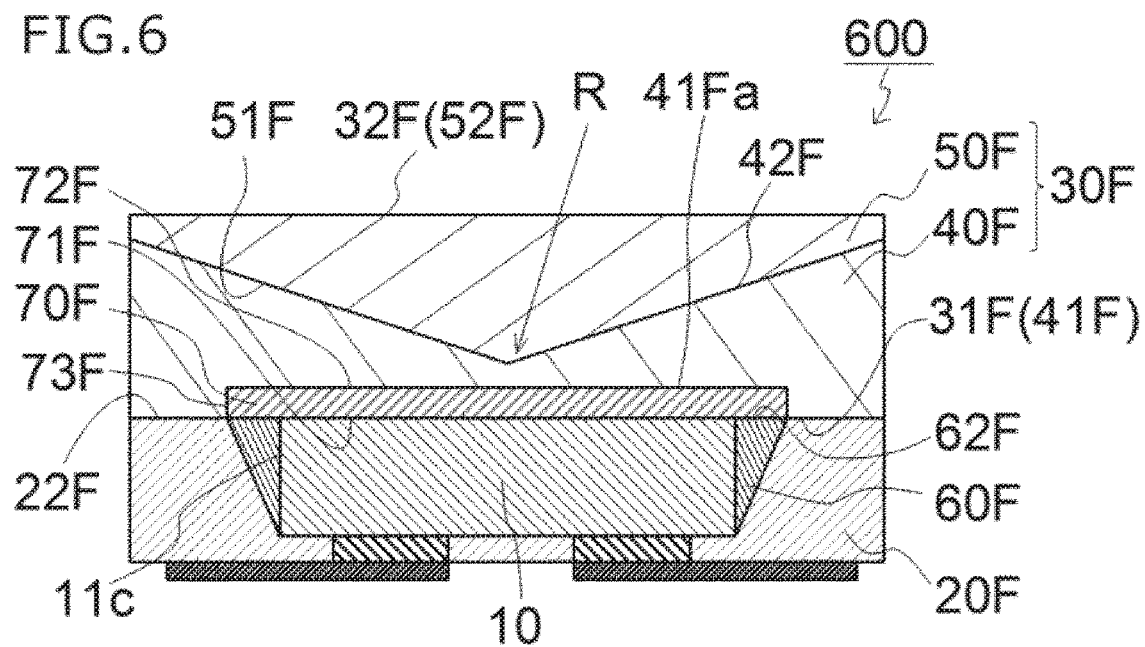
FIG. 6 is a schematic cross-sectional view showing an example of a light emitting device according to a fourth embodiment.

A light emitting device 600 according to a fourth embodiment is shown in FIG. 6. In the fourth embodiment, an upper surface 72F and side surfaces 73F of the wavelength conversion member 70F are covered with a light-transmissive portion 40F of an optical member 30F. Thus, the light from each light emitting element 10 is incident from the upper surface 72F and side surfaces 73F of the wavelength conversion member 70F into the light-transmissive portion 40F. In this way, the light extraction efficiency of the light emitting device can be improved. Hereinafter, differences from the first to third embodiments will mainly be described.

(Coating Member)

In the fourth embodiment, the covering member 20F directly or indirectly covers the side surfaces 11c of the light emitting element 10, and does not cover the side surfaces 73F of the wavelength conversion member 70F. The upper surface 22F of the covering member 20F is flush with the lower surface 71F of the wavelength conversion member 70F.

(Optical Member)

In the fourth embodiment, the lower surface 31F of the optical member 30F is not flush, but has a concave portion 41Fa. Specifically, the lower surface 41F of the light-transmissive portion 40F in the optical member 30F is not flush, but has a concave portion 41Fa. A wavelength conversion member 70F is disposed within the concave portion 41Fa. The lower surface 41F of the light-transmissive portion 40F is flush with the lower surface 71F of the wavelength conversion member 70F. The width (area) of the concave portion 41Fa is preferably the same as the width (area) of each of the first surface 71F and the second surface 72F in the wavelength conversion member 70. The width of each of the first surface 71F and the second surface 72F of the wavelength conversion member 70F may be smaller than the width of the concave portion 41Fa, depending on a formation method of the wavelength conversion member 70F. The center of the concave portion 41Fa preferably coincides with the center of the wavelength conversion member 70F in the top view. Further, the center of the concave portion 41Fa preferably coincides with the vertex R of the light-reflective portion 50F in the top view. The width of the concave portion 41Fa is preferably larger than the width (area) of the light-emitting surface of the light emitting element 10. When the light guide member 60F is provided, the width of the concave portion 41Fa is preferably larger than a sum of the width (area) of the light emitting element 10 and the width (area) of the upper surface 62F of the light guide member 60F. The depth of the concave portion 41Fa is preferably set to a depth at which the desired wavelength conversion member 70F can be disposed.

Figure 7A:
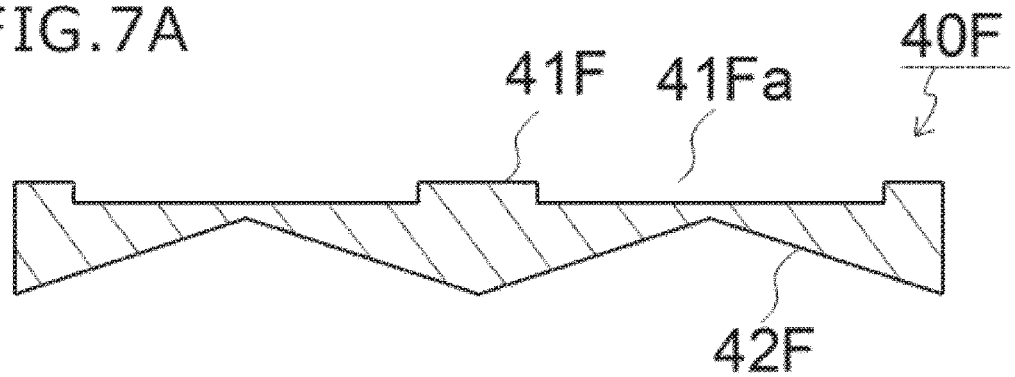
FIG. 7A is a diagram showing a step in a method for manufacturing the light emitting device according to the fourth embodiment.

FIGS. 7A to 7D are diagrams showing some steps in a method for manufacturing the light emitting device according to the fourth embodiment. As shown in FIG. 7A, first, the light-transmissive portion 40F is provided. The light-transmissive portion 40F includes, on the side of the first surface 41F, concave portions 41Fa where the wavelength conversion members can be disposed. The light-transmissive portion 40F has inclined surfaces on the side of the second surface 42F. The light-transmissive portion 40F may be provided by purchasing a commercially available one. The light-transmissive portion 40F having a shape shown in FIG. 7A may be prepared in advance by molding or the like. Alternatively, a light-transmissive portion that has a flat surface as the first surface 41F and inclined surfaces as the second surfaces 42F is first prepared, and thereafter concave portions 41Fa are formed in the light-transmissive portion. In this way, the concave portions 41Fa may be formed in a different step. The second surface 42F can have the shape or the like shown in any one of FIGS. 4A to 4C.

Figure 7B:
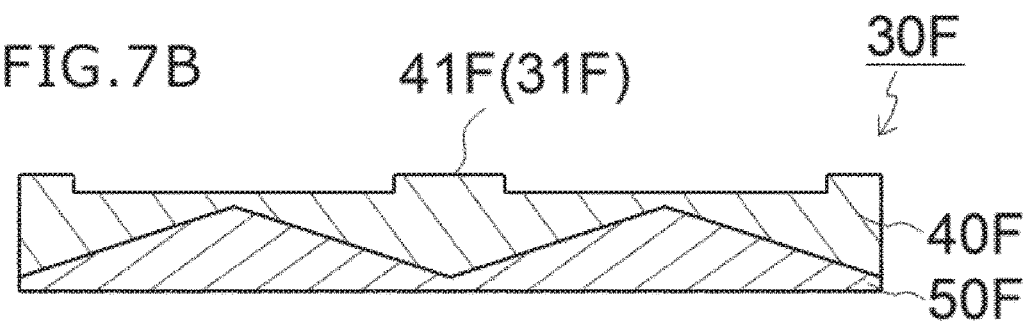
FIG. 7B is a diagram showing another step in the method for manufacturing the light emitting device according to the fourth embodiment.

Then, as shown in FIG. 7B, a light-reflective portion 50F is formed on the side of the second surface 42F of the light-transmissive portion 40F, thereby obtaining an optical member 30F.

Figure 7C:
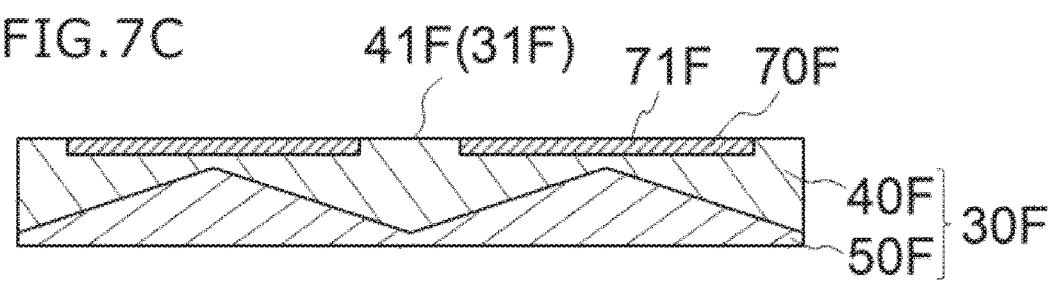
FIG. 7C is a diagram showing another step in the method for manufacturing the light emitting device according to the fourth embodiment.

Then, as shown in FIG. 7C, wavelength conversion members 70F are arranged in concave portions 41Fa on the first surface 31F of the optical member 3OF (the first surface 41F of the light-transmissive portion 40F). The arrangement method of the wavelength conversion member 70F can be the same as that used in the first to fourth embodiments. In particular, the liquid wavelength conversion member 70F is preferably formed in the corresponding concave portion 41Fa by printing or potting. Here, the first surface 41F of the light-transmissive portion 40F and the first surface 71F of the wavelength conversion member 70F are set at the same height, or the first surface 71F of the wavelength conversion member 70F is set higher than the first surface 41F of the light-transmissive portion 40F.

Figure 7D:
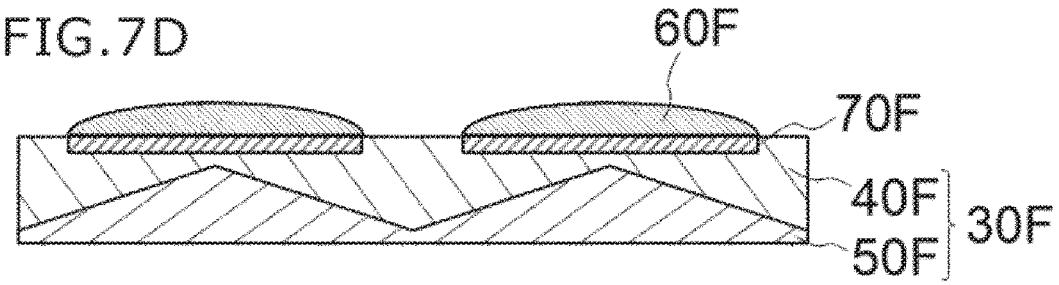
FIG. 7D is a diagram showing another step in the method for manufacturing the light emitting device according to the fourth embodiment.

Then, as shown in FIG. 7D, a liquid light guide member 60F is disposed on the first surface 71F of the wavelength conversion member 70F. Thereafter, the following steps after arranging the light emitting element 10 are the same as the steps in the first to third embodiments, and a description thereof will be omitted.

Fifth Embodiment

Figure 8:
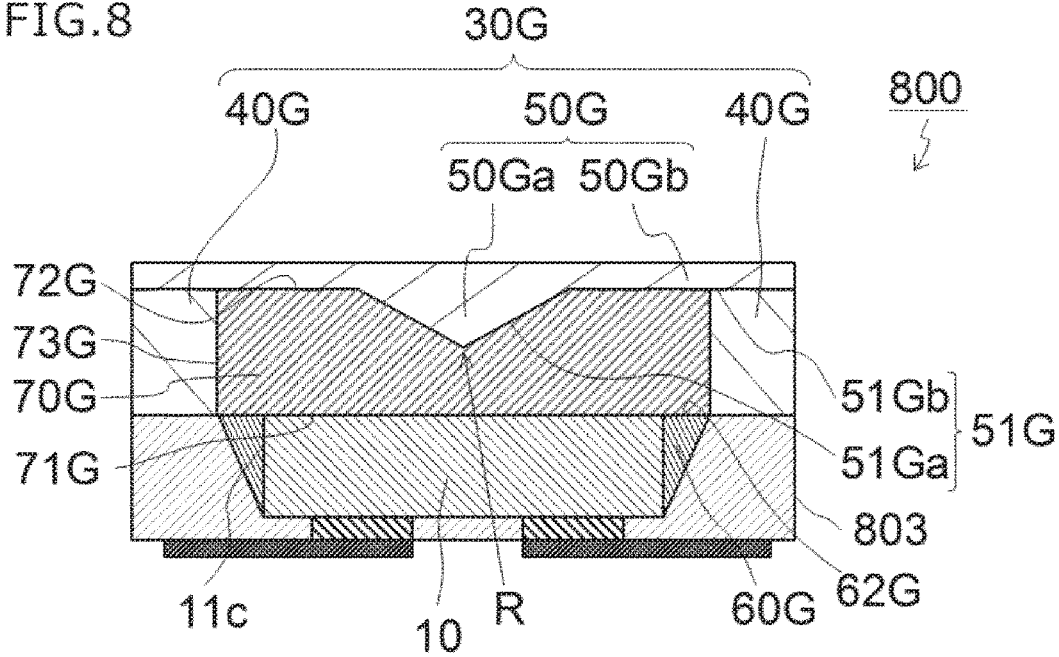
FIG. 8 is a schematic cross-sectional view showing an example of a light emitting device according to a fifth embodiment.

A light emitting device 800 according to a fifth embodiment is shown in FIG. 8. In the fifth embodiment, side surfaces 73G of the wavelength conversion member 70G are covered with a light-transmissive portion 40G of an optical member 30G. An upper surface 72G of the wavelength conversion member 70G is covered with a light-reflective portion 50G of the optical member 30G. Thus, the light from the light emitting element 10 is incident only from side surfaces 73F of the wavelength conversion member 70F into the light-transmissive portion 40G of the optical member 30G. In this way, the light can be spread more laterally. Hereinafter, differences from the first to fourth embodiments will mainly be described.

(Coating Member)

In the fifth embodiment, as with the fourth embodiment, the covering member 20 directly or indirectly covers the side surfaces 11c of the light emitting element 10, and does not cover the side surfaces 73G of the wavelength conversion member 70G.

(Optical Member)

The fifth embodiment is the same as each of the first to fourth embodiments in that the light-transmissive portion 40G and the light-reflective portion 50G of the optical member 30G form parts of the side surfaces 803 of the light emitting device 800. The fifth embodiment differs from the first to fourth embodiments in that a part of the lower surface 51G of the light-reflective portion 50G, which is continuous from each side surface 803 of the light emitting device 800, is in contact with the light-transmissive portion 40G, and the lower surface 51G of the light-reflective portion 50G positioned above the light emitting element 10 is in contact with the wavelength conversion member 70G. In other words, the light-transmissive portion 40G is not disposed above the wavelength conversion member 70G. This makes it possible not only to spread the light more laterally, but also to improve unevenness in color of the emitted light.

Here, although the light-reflective portion 50G includes a convex portion 50Ga and a planar portion 50Gb by way of example, the light-reflective portion 50G can have any shape exemplified in the other embodiments.

The width (area) of a lower surface 71G of the wavelength conversion member 70G is preferably larger than the width (area) of the light emitting element 10. When the light guide member 60G is provided as shown in FIG. 8, the wavelength conversion member 70G is also preferably disposed on the upper surface of the light guide member 60G. The width (area) of the upper surface 72G in the wavelength conversion member 70G may be the same as, or larger or smaller than the width (area) of the lower surface 71G thereof. That is, the side surfaces 73G of the wavelength conversion member 70G can be a vertical or inclined surface. Each side surface 73G of the wavelength conversion member 70G can also be a surface with a step, a curved surface, or the like.

As shown in FIG. 8, the entire second surface 72G of the wavelength conversion member 70G is in contact with the light-reflective portion 50G by way of example. However, the wavelength conversion member 70G is not limited thereto, and a part of the second surface 72G of the wavelength conversion member 70G may be in contact with the light-reflective portion 50G. The wavelength conversion member 70G may be in contact with the convex portion 50Ga and the planar portion 50Gb of the light-reflective portion 50G, or only with the convex portion 50Ga.

Figure 9A:
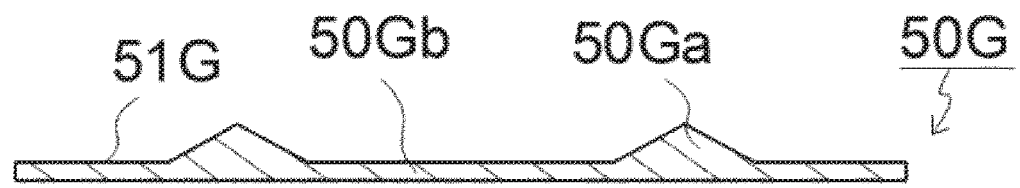
FIG. 9A is a diagram showing a step in a method for manufacturing the light emitting device according to the fifth embodiment.

FIGS. 9A to 9D are diagrams showing some steps in a method for manufacturing the light emitting device according to the fifth embodiment. As shown in FIG. 9A, first, the light-reflective portion 50G is prepared. The light-reflective portion 50G includes convex portions 51Ga and a planar portion 50Gb on the side of the first surface 51G. The first surface 51G of the light-reflective portion 50G can have any shape exemplified in the other embodiments.

Figure 9B:
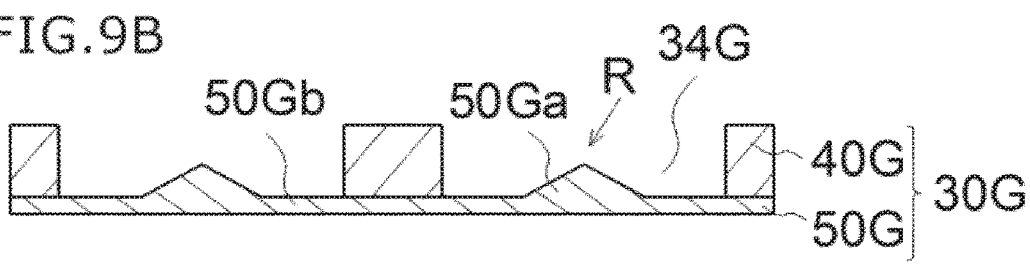
FIG. 9B is a diagram showing another step in the method for manufacturing the light emitting device according to the fifth embodiment.

Then, as shown in FIG. 9B, light-transmissive portions 40G are formed on parts of the first surface 51G of the light-reflective portion 50G. Because the light-transmissive portions 40G are disposed at the side surface 803 of the light emitting device 800, each light-transmissive portion 40G is formed in the position where cutting is performed in the later step of singulation. Here, the light-transmissive portion 40G is formed on the planar portion 50Gb, specifically in a position spaced apart from the convex portion 50Ga of the light-reflective portion 50G. The light-transmissive portions 40G are formed in a matrix in the top view (not shown). Consequently, a plurality of concave portions 34G is formed; each concave portion 34G has a bottom surface at the first surface 51G of the light-reflective portion 50G and sidewalls at the side surfaces of the adjacent light-transmissive portions 40G. The vertex R of the convex portion 50Ga is disposed at the center of the bottom surface of the concave portion 34G.

Figure 9C:
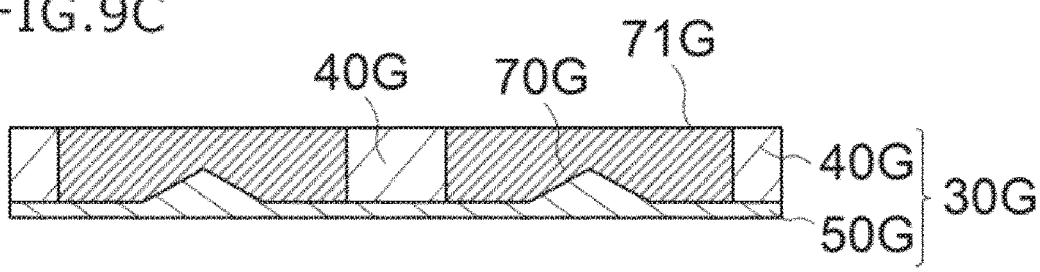
FIG. 9C is a diagram showing another step in the method for manufacturing the light emitting device according to the fifth embodiment.

Then, as shown in FIG. 9C, the wavelength conversion members 70G are disposed within the concave portions 34G.

Figure 9D:
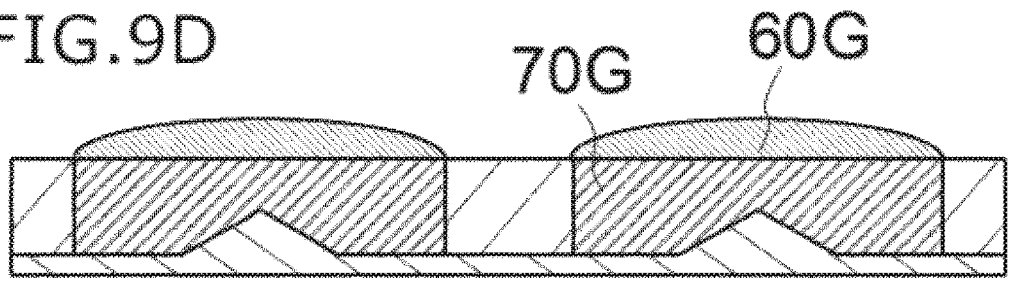
FIG. 9D is a diagram showing another step in the method for manufacturing the light emitting device according to the fifth embodiment.

Subsequently, as shown in FIG. 9D, a liquid light guide member 60G is disposed on the first surface 71G of the wavelength conversion member 70G. Thereafter, the following steps after arranging the light emitting elements on the light guide members 60G are the same as those in the first to fourth embodiments, and a description thereof is omitted below.

Figure 10A:
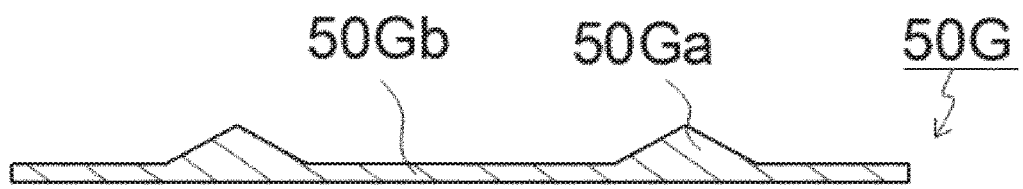
FIG. 10A is a diagram showing a modified example of a step in the method for manufacturing the light emitting device according to the fifth embodiment.
Figure 10B:
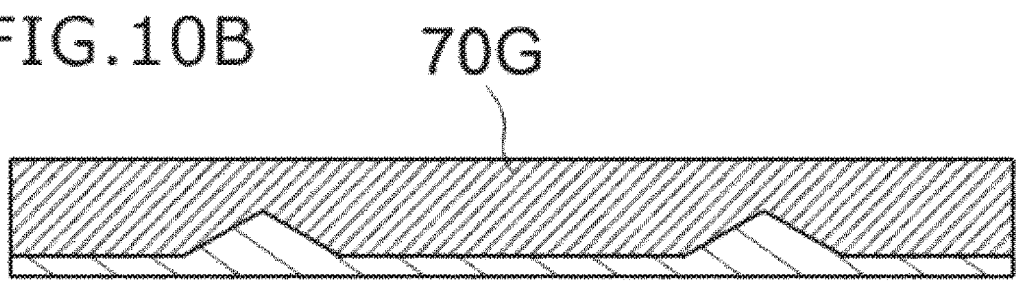
FIG. 10B is a diagram showing a modified example of another step in the method for manufacturing the light emitting device according to the fifth embodiment.
Figure 10C:
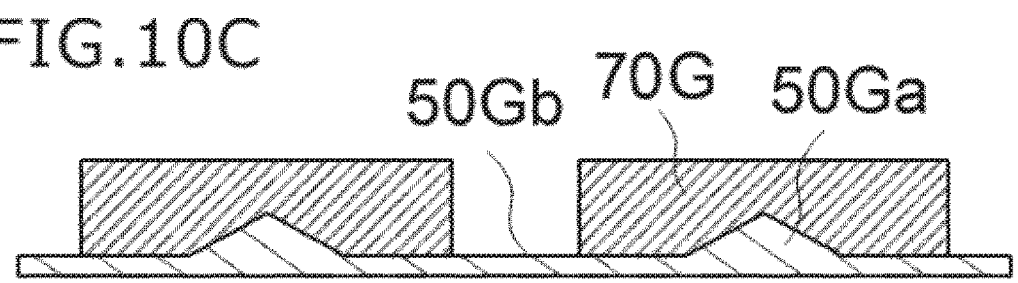
FIG. 10C is a diagram showing a modified example of another step in the method for manufacturing the light emitting device according to the fifth embodiment.
Figure 10D:
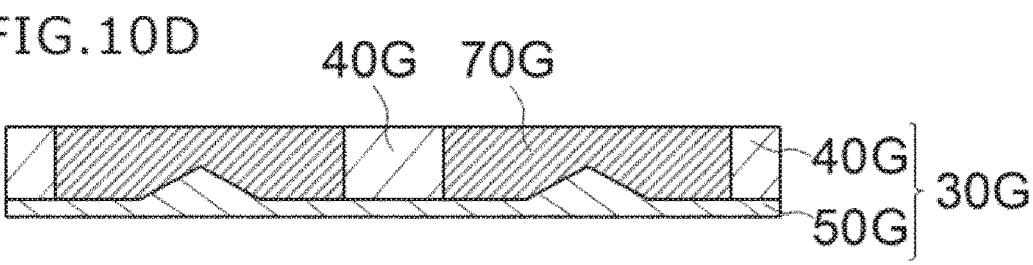
FIG. 10D is a diagram showing a modified example of another step in the method for manufacturing the light emitting device according to the fifth embodiment.

FIGS. 10A to 10D show a modified example of the method for manufacturing the light emitting device 800 according to the fifth embodiment. As shown in FIG. 10A, first, the light-reflective portion 50G is prepared. Then, as shown in FIG. 10B, the wavelength conversion member 70G is formed. Subsequently, as shown in FIG. 10C, parts of the wavelength conversion member 70G located in positions where cutting is performed in the later step are removed to expose the planar portions 50Gb of the light-reflective portion 50G. Then, as shown in FIG. 10D, each light-transmissive portion 40G is formed on the light-reflective portion 50G between the adjacent wavelength conversion members 70G. Even by forming the wavelength conversion members 70G prior to the formation of the light-transmissive portions 40G in this way, the same optical member as the optical member 30G shown in FIG. 9C can also be formed.

Sixth Embodiment

A light emitting device according to a sixth embodiment has the same configuration as the light emitting device of the first embodiment except that side surfaces of an optical member are inclined with respect to the direction perpendicular to an upper surface of the optical member.

Figure 11A:
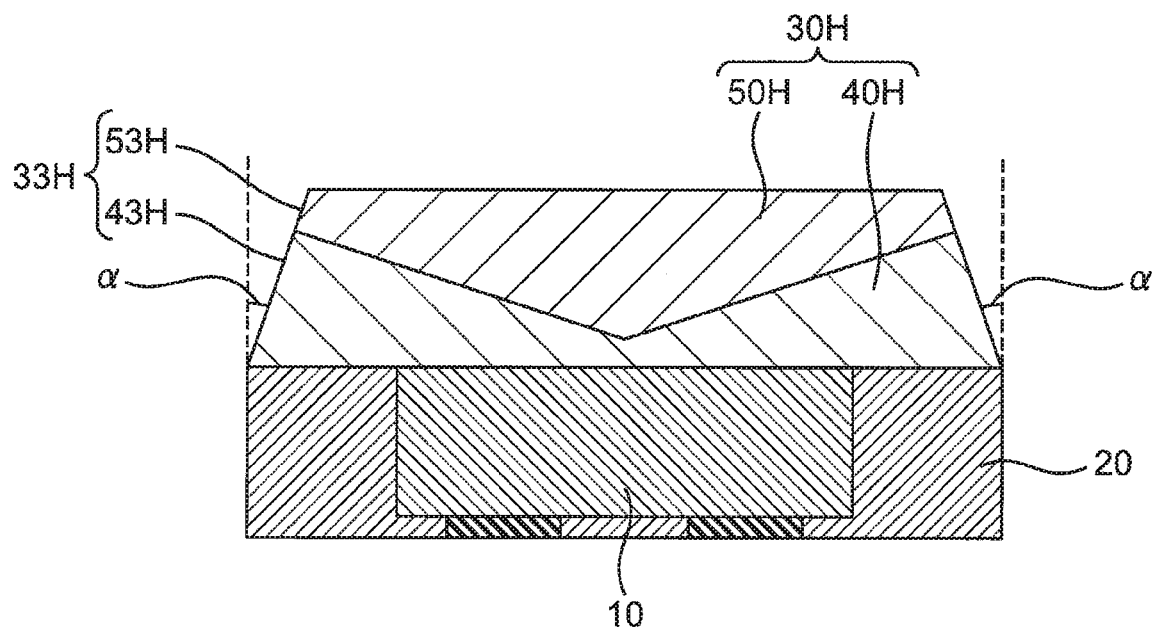
FIG. 11A is a cross-sectional view of an example of a light emitting device according to a sixth embodiment.

Specifically, as shown in FIG. 11A, in the light emitting device according to one aspect of the sixth embodiment, each side surface 33H of an optical member 30H is inclined inward at an inclination angle α with respect to the direction perpendicular to the upper surface of the optical member 30H. The term "inclined inward" as used herein means that the side surface of the optical member is inclined so as to be closer to the central axis of the optical member toward the upper surface thereof, and a is an inclination angle at which the side surface is inclined inward.

In the light emitting device of the one aspect of the present embodiment, as with the first embodiment, the optical member 30H includes a light-reflective portion 50H and a light-transmissive portion 40H. When each side surface 33H of the optical member 30H includes a side surface 43H of the light-transmissive portion 40H and a side surface 53H of the light-reflective portion 50H, at least the side surface 43H of the light-transmissive portion 40H in the side surface 33H of the optical member 30H may be inclined inward.

Figure 11B:
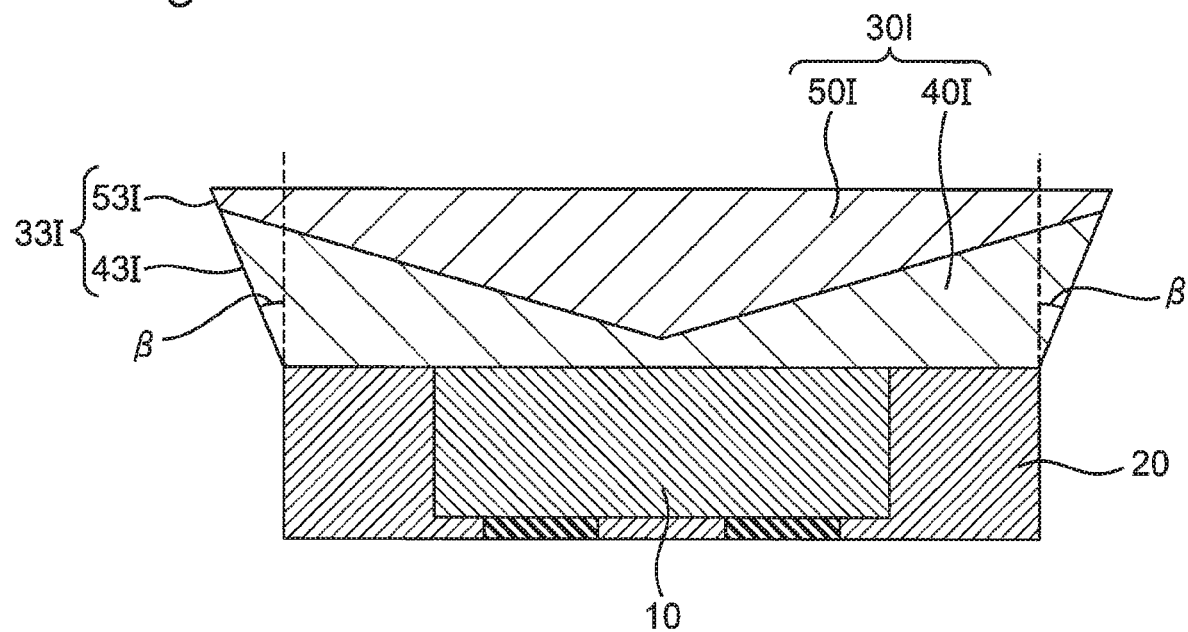
FIG. 11B is a cross-sectional view of another example of the light emitting device according to the sixth embodiment.

As shown in FIG. 11B, in the light-emitting device according to another aspect of the sixth embodiment, each side surface 33I of an optical member 30I is inclined outward at an inclination angle β with respect to the direction perpendicular to the upper surface of the optical member 30I. The term "inclined outward" as used herein means that the side surface of the optical member is inclined so as to be farther away from the central axis of the optical member toward the upper surface, and β is an inclination angle at which the side surface is inclined outward.

In a light emitting device of another aspect, an optical member 30I includes a light-reflective portion 50I and a light-transmissive portion 40I, like the first embodiment. When each side surface 33I of the optical member 30I includes a side surface 43I of the light-transmissive portion 40I and a side surface 53I of the light-reflective portion 50I, at least the side surface 43I of the light-transmissive portion 40I may be inclined outward at the side surface 33I of the optical member 30I.

The light emitting device with the above-described configuration according to the sixth embodiment can control the direction of the light emitted from the side surface 33H, 33I by adjusting the inclination angle α, β of the side surface 33H, 33I of the optical member 30H, 30I, and thus has the following advantages.

First, in addition to being capable of spreading and emitting the light over a wide range in the lateral direction, the light distribution properties of the light emitted in the lateral direction can be controlled more appropriately.

Furthermore, for example, by adjusting the inclination angle α, β of the side surface 33H, 33I of the optical member 30H, 30I at the final stage of a manufacturing process, various different light distribution properties can be realized, thus making it possible to efficiently manufacture the light emitting devices with different light distribution properties. Thus, a variety of light emitting devices having different light distribution properties can be provided at low cost.

In the light-emitting device of the sixth embodiment described above, the side surface 33H, 33I of the optical member 30H, 30I is inclined at a constant inclination angle α, β by way of example. However, in the light-emitting device of the sixth embodiment, the side surface 33H, 33I may be formed by a curved surface, or may be formed by a side surface formed by a protruding or recessed curved surface, instead of the side surfaces 33H and 33I. Also, in this way, the light distribution properties of the light emitted in the lateral direction can be controlled.

The light emitting device of the sixth embodiment, described above, has been described above as having the same structure as the light emitting device of the first embodiment, except that the side surfaces 33H and 33I of the optical members 30H and 30I are inclined at the constant inclination angles α and β, respectively. However, in the light emitting device of the sixth embodiment with the configuration of the light emitting device according to any one of the second to fifth embodiments, for example, the side surface 33H, 33I of the optical member 30H, 30I may be inclined at the constant inclination angle α, β.

Figure 12:
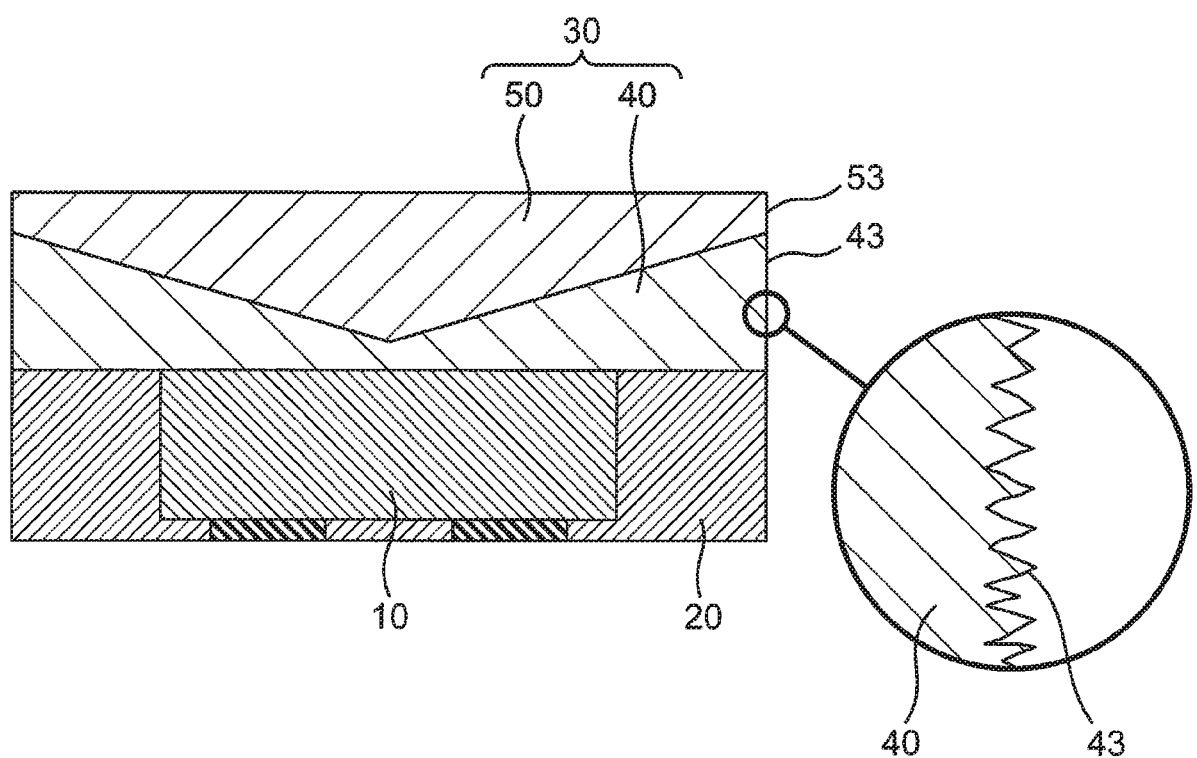
FIG. 12 is a cross-sectional view of a modified example of the light emitting device according to any one of the first to sixth embodiments.

As can be understood from the above description, the light emitting devices according to the first to sixth embodiments can emit the light in a desired direction from the side surface of the light-transmissive portion by appropriately setting the angle or shape of the lower surface of the light-reflective portion, or the surface direction of the side surface of the light-transmissive portion. In addition, the light emitting devices of the first to sixth embodiments make it possible to control the light distribution properties by further controlling a surface roughness of the side surface of the light-transmissive portion. FIG. 12 schematically shows an example in which the surface roughness of the side surface 43 of the light-transmissive portion 40 is increased in the light emitting device of the first embodiment. For example, when a surface roughness Ra of the side surface of the light-transmissive portion is set to a relatively large surface roughness in the range of 0.1 to 50 and preferably in the range of 1 to 20, scattering of light on the side surface of the light-transmissive portion can be increased, thus making it possible to obtain the broad light distribution properties of the light emitted from the side surface of the light-transmissive portion. Here, the term "broad light distribution properties" means the properties achieved by the appropriate angle of the lower surface of the light-reflective portion and/or the appropriate planar direction of the side surface of the light-transmissive portion, and also means that an attenuation rate of the intensity of the light emitted in a direction different from the light distribution center is small, compared to the light distribution properties to be realized on the assumption that there is no scattering of light on the side surface of the light transmitting portion. In this way, if the light distribution properties of the light emitted from the side surface of the light-transmissive portion is broadened, for example, when a plurality of light emitting devices are arranged in a matrix, the light can be uniformly radiated to an irradiation target located at a close position thereto. Consequently, for example, a thinner backlight can be achieved. Further, when the surface roughness of the side surface of the light-transmissive portion is large, total reflection on the side surface of the light-transmissive portion can be reduced, thereby enhancing the light extraction efficiency. In contrast, for example, when the surface roughness Ra of the side surface of the light-transmissive portion is set to a relatively small range of 0.001 to 0.1 and preferably in the range of 0.005 to 0.05, scattering of the light on the side surface of the light-transmissive portion can be reduced, so that the light is emitted based on the light distribution properties set by the angle or shape of the lower surface of the light-reflective portion and the surface direction of the side surface of the light-transmissive portion. When the surface roughness Ra of the side surface of the light-transmissive portion is small, the total reflection on the side surface of the light-transmitting portion tends to increase as the surface roughness Ra decreases. Thus, the surface roughness Ra of the side surface of the light-transmitting portion is preferably equal to or largest than the lower limit value of the above range.

As described above, in the light emitting devices of the first to sixth embodiments, the surface roughness Ra of the side surface of the light-transmissive portion can be appropriately changed to thereby control the light distribution properties of the light emitted from the side surfaces of the light-transmissive portion, because the light distribution properties are realized by the angle of the lower surface of the light-reflective portion and the surface direction of the side surface of the light-transmissive portion.

Therefore, for example, by appropriately changing the surface roughness Ra of the side surface of the light-transmissive portion at the final stage of the manufacturing process, various different light distribution properties can be realized, thus making it possible to efficiently manufacture light-emitting devices having different light distribution properties. This can provide a variety of light-emitting devices having different light distribution properties at low cost.

The surface roughness Ra of the side surface of the light-transmissive portion can be easily adjusted to a desired surface roughness by polishing the side surface of the singulated light emitting device, or by appropriately selecting the size of abrasive grains and/or rotation speed of a cutting blade during singulation.

What is claimed is:
1. A light emitting device comprising:
   a light emitting element comprising:
      a semiconductor multilayer structure that has an electrode formation surface, a light-emitting surface opposite to the electrode formation surface, and side surfaces between the electrode formation surface and the light-emitting surface, and
      a pair of electrodes provided on the electrode formation surface;

a covering member covering the side surfaces of the light emitting element;

an optical member disposed over the light-emitting surface of the light emitting element and an upper surface of the covering member, the optical member comprising:

a light-reflective portion disposed above the light emitting element, wherein a lower surface of the light-reflective portion includes a convex surface and a planar surface, and a light-transmissive portion disposed between the light-reflective portion and the covering member and forming a part of an outer side surface of the light emitting device, wherein the light-transmissive portion does not contain a phosphor; and a wavelength conversion member disposed between the light-emitting surface of the light-emitting element and a lower surface of the light-reflective portion such that an upper surface of the wavelength conversion member directly contacts the convex surface and the planar surface of the lower surface of the light-reflective portion, wherein side surfaces of the wavelength conversion member are covered with the light-transmissive portion of the optical member, wherein a lower surface of the wavelength conversion member is flush with a lower surface of the light-transmissive portion and the upper surface of the covering member, and wherein the wavelength conversion member contains a phosphor, wherein a surface roughness Ra of a side surface of the light-transmissive portion is in the range of 0.1 to 50.

2. The light emitting device according to claim 1, wherein a vertex of the convex surface is located over a center of the a light-emitting surface.

3. The light emitting device according to claim 1, wherein the light-reflective portion is formed of a resin material containing a light-reflective material.

4. The light emitting device according to claim 1, wherein the light-reflective portion is formed of a metal material.

5. The light emitting device according to claim 1, wherein the light-reflective portion is formed of a multilayer dielectric film.

6. The light emitting device according to claim 1, wherein an upper surface of the light-reflective portion is flat.

7. The light emitting device according to claim 1, wherein a side surface of the optical member is inclined inward with respect to a direction perpendicular to an upper surface of the optical member.

8. The light emitting device according to claim 1, wherein a side surface of the optical member is inclined outward with respect to a direction perpendicular to an upper surface of the optical member.

9. The light emitting device according to claim 1, wherein the covering member is light-reflective.

10. The light emitting device according to claim 1, wherein a thickness of the optical member is the same over an entirety of the optical member, and wherein a thickness of the light-transmissive portion is the same over the light-transmissive portion.

11. The light emitting device according to claim 1, wherein an area of a lower surface of the wavelength conversion member is larger than an area of the light-emitting surface of the light-emitting element.

12. The light emitting device according to claim 11, wherein, in a top plan view, an outer periphery of the light emitting element has a quadrilateral shape, and an outer periphery of the wavelength conversion member has a circular shape.

13. The light emitting device according to claim 12, wherein, in the top plan view, the outer periphery of the wavelength conversion member circumscribes the outer periphery of the light emitting element.

14. The light emitting device according to claim 1, further comprising:

a light guide member disposed between the wavelength conversion member and the light-emitting element.

15. The light emitting device according to claim 1, further comprising:

a light guide member disposed to cover the side surfaces of the light-emitting element.

16. The light emitting device according to claim 1, wherein the covering member covers the lower surface of the semiconductor multilayer structure and side surfaces of the electrodes.

17. The light emitting device according to claim 16, wherein an area of a lower surface of the wavelength conversion member is larger than an area of the light-emitting surface of the light-emitting element.

18. The light emitting device according to claim 1, wherein an inner side surface of the covering member is inclined upward and outward.

19. The light emitting device according to claim 1, wherein the light-transmissive portion is not disposed above the wavelength conversion member.

20. The light emitting device according to claim 1, wherein an entirety of the upper surface of the wavelength conversion member directly contacts the lower surface of the light-reflective portion.

* * * * *